US010637519B2

(12) United States Patent
Takayama et al.

(10) Patent No.: US 10,637,519 B2
(45) Date of Patent: Apr. 28, 2020

(54) DUAL-BAND AMPLIFIER

(71) Applicant: THE UNIVERSITY OF ELECTRO-COMMUNICATIONS, Chofu-shi, Tokyo (JP)

(72) Inventors: Yoichiro Takayama, Chofu (JP); Kazuhiko Honjo, Chofu (JP); Ryo Ishikawa, Chofu (JP)

(73) Assignee: THE UNIVERSITY OF ELECTRO-COMMUNICATIONS, Tokyo (JP)

( * ) Notice: Subject to any disclaimer, the term of this patent is extended or adjusted under 35 U.S.C. 154(b) by 0 days.

(21) Appl. No.: 15/735,041

(22) PCT Filed: Jun. 8, 2016

(86) PCT No.: PCT/JP2016/067003
§ 371 (c)(1),
(2) Date: Dec. 8, 2017

(87) PCT Pub. No.: WO2016/199797
PCT Pub. Date: Dec. 15, 2016

(65) Prior Publication Data
US 2018/0115333 A1 Apr. 26, 2018

(30) Foreign Application Priority Data
Jun. 9, 2015 (JP) .................. 2015-117019

(51) Int. Cl.
*H03F 3/68* (2006.01)
*H04B 1/04* (2006.01)
(Continued)

(52) U.S. Cl.
CPC ......... *H04B 1/0483* (2013.01); *H03F 1/0277* (2013.01); *H03F 3/211* (2013.01);
(Continued)

(58) Field of Classification Search
CPC ........ H03F 3/211; H03F 3/245; H03F 1/0277; H03F 3/217; H03F 3/24; H03F 3/68; H04B 1/00
(Continued)

(56) References Cited

U.S. PATENT DOCUMENTS 7,193,472 B2 * 3/2007 Gotou .................. H03F 1/0288
330/124 R
7,528,652 B2 * 5/2009 Kayano .................. H03F 3/68
330/126
(Continued)

FOREIGN PATENT DOCUMENTS

JP H08-256001 A 10/1996
JP H11-234148 A 8/1999
(Continued)

OTHER PUBLICATIONS

Hashemi, Hossein, "Concurrent Multiband Low-Noise Amplifiers—Theory, Design, and Applications", IEEE Transactions on Microwave Theory and Techniques, vol. 50, No. 1, Jan. 2002, pp. 288-301.
(Continued)

*Primary Examiner* — Khanh V Nguyen
*Assistant Examiner* — Khiem D Nguyen
(74) *Attorney, Agent, or Firm* — Oliff PLC

(57) ABSTRACT

A concurrent-type multiband amplifier (or a dual-band amplifier) which amplifies multiband signals concurrently using a plurality of (N) amplifier circuits which each independently amplify signals in a plurality of (N) frequency bands. An n-th (n=any of 1 to N) amplifier circuit is provided with a circuit for blocking signals in frequency bands other than the n-th frequency band so as to amplify and output only the n-th frequency band signal. The n-th amplifier circuit is designed so as to consist of its input/output
(Continued)

impedance matching circuit for the n-th an amplifier element at the n-th frequency band.

11 Claims, 8 Drawing Sheets

(51) Int. Cl.
  *H04B 1/00* (2006.01)
  *H03F 3/24* (2006.01)
  *H03F 3/21* (2006.01)
  *H03F 1/02* (2006.01)
  *H03F 3/217* (2006.01)
(52) U.S. Cl.
  CPC .............. *H03F 3/217* (2013.01); *H03F 3/24* (2013.01); *H03F 3/245* (2013.01); *H03F 3/68* (2013.01); *H04B 1/00* (2013.01); *H04B 1/04* (2013.01); *H03F 2200/111* (2013.01); *H03F 2200/429* (2013.01); *H04B 2001/045* (2013.01); *H04B 2001/0408* (2013.01)
(58) Field of Classification Search
  USPC ...................................... 330/295, 124 R, 302
  See application file for complete search history.

(56) References Cited

U.S. PATENT DOCUMENTS 8,717,102 B2 * 5/2014 Wilson .................... H03F 3/193
                                                    330/124 R
2008/0129410 A1   6/2008  Fukuda et al.
2011/0301040 A1  12/2011  Maiuzzo et al.

FOREIGN PATENT DOCUMENTS

JP    2004-364068 A    12/2004
JP    2008-113202 A     5/2008

OTHER PUBLICATIONS

Uchida, Koji et. al., "Dual-Band GaAs FET Power Amplifier with Two-Frequency Matching Circuits" Department of Electrical Engineering and Computer Sciences, University of Hyogo 2167 Shosha, Himeji, Hyogo, 671-2201 Japan, IEEE 2005.

Ji, Seung Hun et. al., "Concurrent Dual-Band Class-E Power Amplifier Using Composite Right/Left-Handed Transmission Lines", IEEE Transaction on Microwave Theory and Techniques, vol. 55, No. 6, Jun. 2007, pp. 1341-1347.

Colantonio P. et al., "Simultaneous Dual-Band High Efficiency Harmonic Tuned Power Amplifier in GaN Technology", Proceedings of the 2nd European Microwave Integrated Circuits Conference, Oct. 2007, pp. 127-130.

Chen, Kenle et. al., "Highly Linear and Highly Efficient Dual-Carrier Power Amplifier Based on Low-Loss RF Carrier Combiner", IEEE Transactions on Microwave Theory and Techniques, vol. 62, No. 3, Mar. 2014, pp. 590-599.

* cited by examiner

DUAL-BAND AMPLIFIER

TECHNICAL FIELD

The present invention relates to a transmission power amplifier for a next-generation mobile communication system, particularly to a transmission power amplifier for a wireless communication device capable of coping with a plurality of frequency bands, which will be necessary for a next-generation mobile communication system in which advanced utilization of frequencies (such as frequencies for cognitive wireless communication) is progressed.

BACKGROUND ART

In recent years, due to the advancement of mobile communication/wireless LAN and the advancement of communication systems (such as cognitive wireless communication) in order to improve the efficiency of existing systems, necessary for coping with a plurality of communication methods and a plurality of signal frequency bands becomes higher, so that there is an increased demand for a multi-band amplifier capable of processing multi-band signals corresponding to a plurality of communication methods and a plurality of signal frequency bands, with respect to wireless communication devices.

In order to promote a wireless device so as to be able to cope with multi-band, research and development is carried out for a type of amplifier in which signals in a plurality of frequency bands are processed by a single transmitter or receiver, aiming at miniaturization, as well as for a conventional type of amplifier in which signals are processed while switching a plurality of transmitters and receivers, each processing signals in a single different signal frequency band. The former type is configured such that the filter, the mixer, the amplifier and the like which constitute the transmitter and the receiver can cope with a plurality of frequency bands. Further, the technique has been advanced from the type in which only signals in one frequency band can be concurrently processed to the type in which signals in a plurality of frequency bands can be concurrently processed.

In the aforesaid research and development, how to achieve multi-band operation of a transmission power amplifier, which is a core technique of a wireless device, becomes a key problem; with the type in which signals in a plurality of frequency bands are amplified while switching the plurality of frequency bands, signals in the plurality of frequency bands cannot be concurrently amplified. It is recognized that, in a future mobile communication system, advanced utilization of frequencies will become increasingly important, and a concurrent-type multi-band amplifier capable of concurrently amplifying signals in a plurality frequency bands will become a key technology.

As described in NPL 1, conventionally the concurrent-type multi-band amplifier began to be used when developing a low noise amplifier. Thereafter, research and development began to be focused on the concurrent-type multi-band power amplifier; up to now, there are many reports on research and development of a plural matching type and the like which achieves a plurality of impedance matching conditions in a plurality of signal frequency bands with respect to a signal transistor. For example, such reports include NPL 2, NPL 3 and the like, as literature other than patent literature. Such reports also include the PL 1, PL 2, PL 3, PL 4 and the like, as relevant patent literature.

CITATION LIST

Non Patent Literature

NPL 1: H. Hashemi et al., Concurrent multiband low-noise amplifiers-theory, design, and applications (Invited paper)," IEEE Trans. Microwave Theory and Techniques, vol. 50, no. 1, pp. 288-301, January 2002.

NPL 2: K. Uchida et al., "Dual-band GaAs FET power amplifier with two-frequency matching circuits," Proc. of Asia-Pacific Microwave Conference, pp. 197-200, December, 2005.

NPL 3: S. Hun Ji et al., "Concurrent dual-band class-E power amplifier using composite right/left-handed transmission linens," IEEE Trans. Microwave Theory and Techniques, vol. 55, no. 6, pp. 1341-1347, June 2007.

NPL 4: P. Colantonio et al., "simultaneous dual-band high efficiency harmonic tuned power amplifier in GaN technology," Proc. European Microwave Integrated Circuits Conference, pp. 127-130, October 2007.

Patent Literature

PTL 1: Japanese Unexamined Patent Application Publication No. H11-234148

PTL 2: Japanese Unexamined Patent Application Publication No. 2008-154233

PTL 3: Japanese Unexamined Patent Application Publication No. 2010-200310

PTL 4: Japanese Unexamined Patent Application Publication No. 2013-143770

SUMMARY OF INVENTION

Technical Problem

However, when designing input/output impedance matching circuits of the amplifier of the aforesaid type, it is necessary to satisfy a plurality of matching conditions at the same time, so that the circuit configuration becomes complicated and the number of the elements becomes large. Thus, it will be difficult to improve design accuracy, and loss of circuit will become large.

Conventionally, since a plurality of frequency signals are inputted into one transistor, the signal output power will become saturated early with respect to the signal input power, compared with the case where a signal frequency signal in inputted, and also, distortion characteristics will be deteriorated, which is a big problem.

The invention of the present application is made to solve the aforesaid problems, and an object of the invention of the present application is to provide a concurrent-type multi-band power amplifier to solve the problems caused by using concurrently using a single transistor to be able to easily designing circuit and achieve excellent power amplification characteristics.

Solution to Problem

To achieve the aforesaid object, a first invention of the present application is made to provide a concurrent-type multi-band power amplifier which concurrently amplifies signals in a plurality of frequency bands (multi-band), wherein the concurrent-type multi-band power amplifier is formed by a plurality of pieces of (N pieces: N is a natural number not less than 2) transistor amplifier circuits which are: amplifier circuits 10, 20 . . . 50 . . . 70, as shown in FIG.

1A and FIG. 1B, to independently amplify signals in a plurality of pieces of (N pieces: N is a natural number not less than 2) frequency bands. An n-th (n=any of 1 to N) amplifier circuit is provided with circuits 52, 53 which block signals in frequency bands other than the signal in an n-th frequency band, and is adapted to amplify the signal in the n-th frequency band.

The n-th transistor amplifier circuit 50 includes the circuits 52, 53 which block signals in frequency bands other than the signal in an n-th frequency band, and functions as an input impedance matching circuit and an output impedance matching circuit with respect to a transistor (which is an amplifying element). Thus, optimal characteristics can be achieved for each frequency band.

According to the present invention, since signals in a plurality of frequency bands are not concurrently amplified by a single amplifier circuit, the aforesaid problem caused due to being amplified by a single amplifier circuit will not occur, so that it is possible to achieve a multi-band power amplifier with high efficiency and less distortion.

Further, the multi-band amplifier according to a second invention of the present application is characterized in that, in the multi-band amplifier according to the first invention, each amplifier circuit has an input impedance matching circuit and an output impedance matching circuit, and the input impedance matching circuit and the output impedance matching circuit of the n-th amplifier circuit respectively have a signal source impedance viewed from a transistor and a load impedance viewed from the transistor which allow to achieve optimal signal input/output characteristics in the n-th frequency band The multi-band amplifier according to a third invention of the present application is, as an example shown in FIG. 2, a dual-band amplifier which concurrently amplifies a signal in a first frequency band and a signal in a second frequency band, comprising:

a first amplifier circuit 30 which amplifies the signal in the first frequency band; and a second amplifier circuit 40 which amplifies the signal in the second frequency band, wherein the first amplifier circuit 30 has a second frequency band blocking circuit 32, 33 arranged in each of an input signal dividing part and an output signal combining part thereof, the second frequency band blocking circuit 32, 33 blocking the signal in the second frequency band, and wherein the second amplifier circuit 40 has a first frequency band blocking circuit 42, 43 arranged in each of an input signal dividing part and an output signal combining part thereof, the first frequency band blocking circuit 42, 43 blocking the signal in the first frequency band.

Further, the dual-band amplifier according to a fourth invention of the present application is characterized in that, as an example shown in FIG. 4, in the second invention, the second frequency band blocking circuit is formed by providing in series a circuit 36, 37 in each of the input signal dividing part and the output signal combining part of the first amplifier circuit 30, the circuit 36, 37 being a circuit whose parallel resonance frequency falls into the second frequency band, and the first frequency band blocking circuit is formed by providing in series a circuit in each of the input signal dividing part and the output signal combining part of the second amplifier circuit, the circuit being a circuit whose parallel resonance frequency falls into the first frequency band.

Further, the dual-band amplifier according to a fifth invention of the present application is characterized in that, as an example shown in FIG. 5, in the second invention, the second frequency band blocking circuits 57, 59 are formed by providing in series circuits 36, 37 in each of the input signal dividing part and the output signal combining part of the first amplifier circuit 30A, the circuit 36, 37 being a circuit whose parallel resonance frequency falls into the second frequency band, and providing in series inserted circuit elements 56, 58 in each of the input signal dividing part and the output signal combining part of the first amplifier circuit, the circuit elements 56, 58 cancelling series reactance components of the circuit 36, 37 in the first frequency band, and the first frequency band blocking circuits 67, 69 is formed by providing in series circuits 46, 47 in each of the input signal dividing part and the output signal combining part of the second amplifier circuit 40A, the circuits 46, 47 being a circuit whose parallel resonance frequency falls into the first frequency band, and providing in series serially inserted circuit elements 66, 68 in each of the input signal dividing part and the output signal combining part of the second amplifier circuit, the circuit elements 66, 68 cancelling series reactance components of the circuits 46, 47 in the second frequency band.

Further, the dual-band amplifier according to a sixth invention of the present application is characterized in that, in the third or fourth invention, the circuits 36, 37 whose parallel resonance frequency falls into the second frequency band and the circuits 46, 47 whose parallel resonance frequency falls into the first frequency band are each formed by an inductor and a capacitor connected to each other in parallel.

Further, the dual-band amplifier according to a seventh invention of the present application is characterized in that, as an example shown in FIG. 6, in the second invention, the input signal dividing part and the output signal combining part of the first amplifier circuit 30 are each provided with the second frequency band blocking circuits 32, 33 which are formed by series transmission lines 72, 74 whose characteristic impedance is 50Ω and whose length is equal to a quarter of the wavelength of the signal in the second frequency band, and circuits 73, 75 which short-circuit the signal in the second frequency band, and the input signal dividing part and the output signal combining part of the second amplifier circuit 40 are each provided with the first frequency band blocking circuits 42, 43 which are formed by serial series transmission lines 82, 84 whose characteristic impedance is 50Ω and whose length is equal to a quarter of the wavelength of the signal in the first frequency band, and circuits 83, 85 which short-circuit the signal in the first frequency band.

Further, the dual-band amplifier according to an eighth invention of the present application is characterized in that, as an example shown in FIG. 7, in the second invention, the input signal dividing part and the output signal combining part of the first amplifier circuit 30B are each provided with second frequency band blocking circuits 321, 331 which are formed by series transmission lines 72, 74 whose characteristic impedance is 50Ω and whose length is equal to a quarter of the wavelength of the signal in the second frequency band, circuits 73, 75 which short-circuit the signal in the second frequency band, and circuits 38, 39 which cancel, in the first frequency band, susceptance components of the circuits 73, 75 which short-circuit the signal in the second frequency band, and the input signal dividing part and the output signal combining part of the second amplifier circuit are each provided with first frequency band blocking circuits 421, 431 which is formed by series transmission lines 82, 84 whose characteristic impedance is 50Ω and whose length is equal to a quarter of the wavelength of the signal in the first frequency band, circuits 83, 85 which short-circuit the signal in the first frequency band, and circuits 48, 49 which cancel, in the second frequency band, susceptance components of the circuits 83, 85 which short-circuit the signal in the first frequency band.

Further, the dual-band amplifier according to a ninth invention of the present application is characterized in that, as an example shown in FIG. 8, in the sixth invention, the circuit which short-circuits the signal in the second frequency band provided in each of the input signal dividing part and the output signal combining part of the first amplifier circuit 30C is formed by parallel stubs 731, 751 whose tip is opened, and the circuit which short-circuits the signal in the first frequency band provided in each of the input signal dividing part and the output signal combining part of the second amplifier circuit 40C is formed by parallel stubs 831, 851 whose tip is opened.

Further, the dual-band amplifier according to a tenth invention of the present application is characterized in that, as an example shown in FIG. 9, in the sixth invention, the circuit which short-circuits the signal in the second frequency band provided in each of the input signal dividing part and the output signal combining part of the first amplifier circuit 30D is formed by series resonance circuits 732, 752 consisting of an inductor and a capacitor, and the circuit which short-circuits the signal in the first frequency band provided in each of the input signal dividing part and the output signal combining part of the second amplifier circuit 40D is formed by series resonance circuits 832, 852 consisting of an inductor and a capacitor.

Further, the dual-band amplifier according to an eleventh invention of the present application is characterized in that, as an example shown in FIG. 10, in the seventh invention, the circuits 731, 751 which short-circuit the signal in the second frequency band and the circuits 381, 391 which cancel, in the first frequency band, susceptance components of the circuits 731, 751 which short-circuit the signal in the second frequency band provided in each of the input signal dividing part and the output signal combining part of the first amplifier circuit 30B are each formed by parallel stubs whose tip is opened or short-circuited, and the circuits 831, 851 which short-circuit the signal in the first frequency band and the circuits 481, 491 which cancel, in the second frequency band, susceptance components of the circuits 831, 851 which short-circuit the signal in the first frequency band provided in each of the input signal dividing part and the output signal combining part of the second amplifier circuit 40B are each formed by parallel stubs whose tip is opened or short-circuited.

Further, the dual-band amplifier according to a twelfth invention of the present application is characterized in that, as an example shown in FIG. 11, in the seventh invention, the circuits 731, 751 which short-circuit the signal in the second frequency band provided in each of the input signal dividing part and the output signal combining part of the first amplifier circuit 30B are formed by parallel stubs whose tip is opened; and the circuits 382, 392 which cancel, in the first frequency band, susceptance components of the circuits 731, 751 which short-circuit the signal in the second frequency band provided in each of the input signal dividing part and the output signal combining part of the first amplifier circuit 30B are formed by an inductor, and the circuits 831, 851 which short-circuit the signal in the first frequency band provided in each of the input signal dividing part and the output signal combining part of the second amplifier circuit 40B are formed by parallel stubs whose tip is opened; and the circuits 482, 492 which cancel, in the second frequency band, susceptance components of the circuits 831, 851 which short-circuit the signal in the first frequency band provided in each of the input signal dividing part and the output signal combining part of the first amplifier circuit 40B are formed by a capacitor.

Further, the dual-band amplifier according to a thirteenth invention of the present application is characterized in that, as an example shown in FIG. 12, in the seventh invention, the circuit which short-circuits the signal in the second frequency band provided in each of the input signal dividing part and the output signal combining part of the first amplifier circuit 30B are formed by series resonance circuits 732, 752 consisting of an inductor and a capacitor; and the circuits 383, 393 which cancel, in the first frequency band, susceptance components of the circuits 732, 752 which short-circuit the signal in the second frequency band provided in each of the input signal dividing part and the output signal combining part of the first amplifier circuit 30B are formed by an inductor, and the circuit which short-circuits the signal in the first frequency band provided in each of the input signal dividing part and the output signal combining part of the second amplifier circuit 40B are formed by series resonance circuits 832, 852 consisting of an inductor and a capacitor; and the circuits 483, 493 which cancel, in the second frequency band, susceptance components of the circuits 832, 852 which short-circuit the signal in the first frequency band provided in each of the input signal dividing part and the output signal combining part of the second amplifier circuit 40B are formed by a capacitor.

Further, the dual-band amplifier according to a fourteenth invention of the present application is characterized in that, as an example shown in FIG. 13, in the seventh invention, the circuit which short-circuits the signal in the second frequency band provided in each of the input signal dividing part and the output signal combining part of the first amplifier circuit 30B are formed by series resonance circuits 732, 752 consisting of an inductor and a capacitor; and the circuits 384, 394 which cancel, in the first frequency band, susceptance components of the circuits 732, 752 which short-circuit the signal in the second frequency band provided in each of the input signal dividing part and the output signal combining part of the first amplifier circuit 30B are formed by parallel stubs whose tip is opened of short-circuited, and the circuit which short-circuits the signal in the first frequency band provided in each of the input signal dividing part and the output signal combining part of the second amplifier circuit 40B are formed by series resonance circuits 832, 852 consisting of an inductor and a capacitor; and the circuits 484, 494 which cancel, in the second frequency band, susceptance components of the circuits 832, 852 which short-circuit the signal in the first frequency band provided in each of the input signal dividing part and the output signal combining part of the second amplifier circuit 40B are formed by parallel stubs whose tip is opened or short-circuited.

Further, the dual-band amplifier according to a fifteenth invention of the present application is characterized in that, in any one of the second to thirteenth inventions, the first and second amplifier circuits each have input impedance matching circuits 34, 44 and output impedance matching circuits 35, 45, and the input impedance matching circuits 34, 44 and the output impedance matching circuits 35, 45 of the first amplifier circuit and the second amplifier circuit have signal source impedances and load impedances for transistors of the first and second amplifiers so that optimal signal input/output characteristics of the input impedance matching circuits 34, 44 and the output impedance matching circuits 35, of the first amplifier circuit and the second amplifier circuit in the first frequency band and the second frequency band are achieved.

With the present invention, it is possible to solve problems such as complicated configuration of the input/output impedance matching circuits and design thereof caused by concurrently using a single transistor, increased loss of circuit, deteriorated saturation characteristics of the output power and distortion characteristics due to increased non-linearity influence caused by concurrent amplification, so that it become possible to independently design each amplifier circuit. As a result, it is possible to enhance design accuracy, suppress deterioration of the saturation characteristics of the output power, and suppress increase of the distortion characteristics.

BRIEF DESCRIPTION OF DRAWINGS

FIG. 1A and FIG. 1B are diagrams showing the configuration of a multi-band amplifier according to a first embodiment of the present invention, wherein FIG. 1A shows a schematic configuration of the multi-band amplifier, and FIG. 1B is a schematic diagram showing a circuit example of the multi-band amplifier;

FIG. 3A and FIG. 3B are graphs showing an example of concurrent amplifying characteristics of signals of two frequencies $f_1$ and $f_1$ of the dual-band amplifier according to the present invention, wherein FIG. 3A shows an output power $P_{out}$ with respect to an input power, a power added efficiency (PAE) with respect to the input power, and a drain efficiency $\eta_D$, and FIG. 3B shows an output power spectrum of each frequency;

DESCRIPTION OF EMBODIMENTS

Embodiments of the present invention will be described below with reference to the attached drawings. Note that, as embodiments for better understanding the present invention, a dual-band amplifier, as an example, is briefly described in and after an second embodiment; however, it is to be understood that each embodiment may be used in combination, and the configurations in and after the second embodiment may also be applied to a multi-band amplifier shown in a first embodiment.

First Embodiment

Figure 1A:
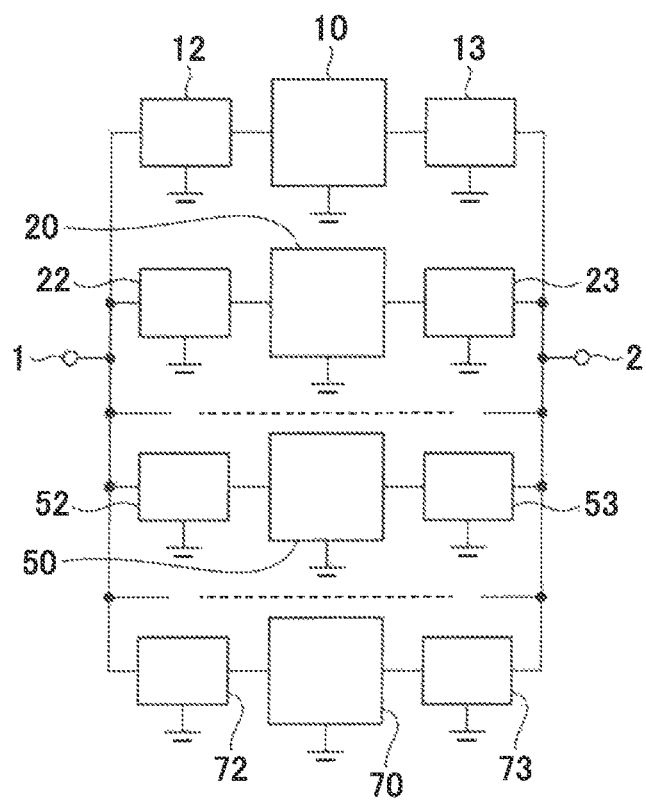
Figure 1B:
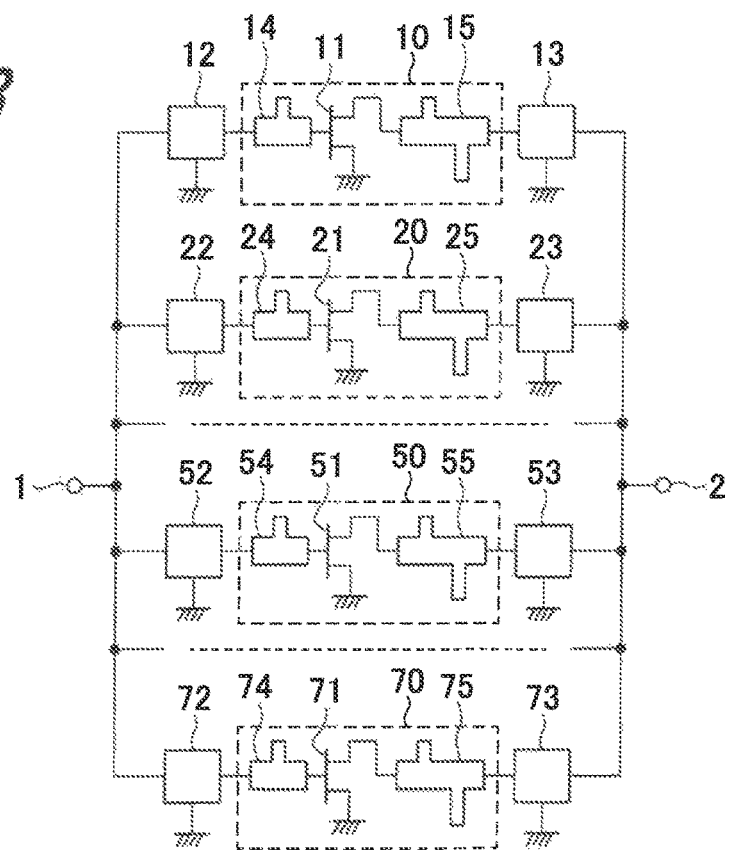

FIG. 1A and FIG. 1B are diagrams showing the configuration of a multi-band amplifier according to a first embodiment of the present invention. The multi-band amplifier according to the present embodiment is a multi-band amplifier adapted to concurrently amplify signals in a plurality of frequency bands from a first frequency band to an N-th frequency band (N is a natural number not less than 2).

As shown in FIG. 1A, the multi-band amplifier according to the first embodiment of the present invention includes a signal input terminal 1 and a signal output terminal 2. The multi-band amplifier has a plurality of amplifier circuits from a first amplifier circuit to an N-th amplifier circuit, which are: amplifier circuits 10, 20 . . . 50 . . . 70. Here N is a natural number not less than 2. Each amplifier circuit is a "transistor amplifier circuit" formed by a FET (Field Effect Transistor), and the "transistor amplifier circuit" will be simply referred to as an "amplifier circuit" hereinafter.

A first amplifier circuit 10 is provided with, in an input signal dividing part thereof (which corresponds to the input side of the amplifier circuit 10), an input-side blocking circuit 12 adapted to block signals in frequency bands other than the first frequency band. The amplifier circuit 10 is further provided with, in an output signal combining part thereof (which corresponds to the output side of the amplifier circuit 10), an output-side blocking circuit 13 adapted to block signals in frequency bands other than the first frequency band.

The second amplifier circuit 20 is provided with, in an input signal dividing part and an output signal combining part thereof, an input-side blocking circuit 22 and an output-side blocking circuit 23 respectively adapted to block signals in frequency bands other than the second frequency band. Similarly, an n-th (n=3 to (N−1)) amplifier circuit 50 is provided with, in an input signal dividing part and an output signal combining part thereof, an input-side blocking circuit 52 and an output-side blocking circuit 53 respectively adapted to block signals in frequency bands other than the n-th frequency band. The N-th amplifier circuit 70 is provided with, in an input signal dividing part and an output signal combining part thereof, an input-side blocking circuit 72 and an output-side blocking circuit 73 respectively adapted to block signals in frequency bands other than the N-th frequency band.

In the diagrams shown in FIG. 1A and FIG. 1B, among the signals in multi-bands from the first frequency band to the N-th frequency band applied to the multi-band amplifier from the signal input terminal 1, the signals in frequency bands other than the first frequency band are blocked by the input-side blocking circuit 12, so that only the signal in the first frequency band is inputted into the amplifier circuit 10. The signal in the first frequency band amplified by the amplifier circuit 10 is outputted from the signal output terminal 2 through the output-side blocking circuit 13.

Among the signals in the multi-bands applied to the multi-band amplifier from the signal input terminal 1, the signals in frequency bands other than the second frequency band are blocked by the input-side blocking circuit 22, so that only the signal in the second frequency band is inputted into the amplifier circuit 20. The signal in the second frequency band amplified by the amplifier circuit 20 is outputted from the signal output terminal 2 through the output-side blocking circuit 23.

Similarly, only the signal in the n-th (n=3 to (N−1)) frequency band is inputted into the amplifier circuit 50 where the signal is amplified, and the amplified signal is outputted from the signal output terminal 2. Similarly, only the signal in the N-th frequency band is inputted into the amplifier circuit 70 where the signal is amplified, and the amplified signal is outputted from the signal output terminal 2. Incidentally, the signals in the multi-bands from the first frequency band to the N-th frequency band having been amplified by the amplifier circuits 10, 20 . . . 50 . . . 70 are integrated and outputted from the signal output terminal 2.

Incidentally, in the case where the amplifying element of each amplifier circuit of the present embodiment is formed by transistor(s), the amplification operation of the transistor(s) is not limited to a specific mode (such as Class-A, Class-B, Class-C, Class-F, Inverse Class-F, Class-E, harmonic reactance termination amplifier, Doherty amplifier or the like). Further, each amplifier circuit may be configured as a multi-stage amplifier circuit, instead of being limited to a single-stage amplifier. In the case where each amplifier circuit is configured as a multi-stage amplifier circuit by transistors, the number of the stages of the amplifier circuit for each frequency does not have to be the same. Further, the amplifier circuit for the signal in each of the plurality of frequency bands may be configured independently of the amplifier circuits for other frequency bands, and characteristics of the plurality of frequency bands may be set independently of each other.

Each amplifier circuit includes a FET (which is an amplifying element), an input impedance matching circuit arranged on the input side of the FET, and an output impedance matching circuit arranged on the output side of the FET. For example, the input impedance matching circuit and the output impedance matching circuit of the n-th amplifier circuit 50 include the input-side blocking circuit 52 and the output-side blocking circuit 53 (which both block the signals in frequency bands other than the n-th frequency band), and are adapted to perform input impedance matching and output impedance matching with respect to the transistor (which is an amplifying element).

To be specific, the input impedance matching circuit is designed such that the impedance when viewing the side of the signal source from the FET is equal to a signal source impedance $Z_{ST1}$ of the FET which achieves the maximum power added efficiency of the FET. Further, the output impedance matching circuit is designed such that the impedance when viewing the side of the load from the FET is equal to a load impedance $Z_{LT1}$ of the FET which achieves the maximum power added efficiency of the FET. In other words, the input impedance matching circuit and the output impedance matching circuit perform a function for converting a signal source impedance $Z_{S1}$ and a load impedance $Z_{L1}$ when viewing the input-side blocking circuit 52 and the output-side blocking circuit 53 from the amplifier circuit 50 respectively into the signal source impedance $Z_{ST1}$ and the load impedance $Z_{LT1}$ of the FET (which both achieve the maximum power added efficiency of the FET). Thus, optimal characteristics can be achieved for each frequency band.

FIG. 1B is a diagram showing an example in which the input impedance matching circuit is arranged on the input side of the FET, and the output impedance matching circuit is arranged on the output side of the FET.

The first amplifier circuit 10 includes a FET 11 (which is an amplifying element), and has an input impedance matching circuit 14 arranged therein, wherein the input impedance matching circuit 14 is adapted to perform input impedance matching with respect to the signal in the first frequency band of the FET 11 and achieve reactance termination with respect to a second harmonic. The first amplifier circuit 10 has an output impedance matching circuit 15 arranged therein, wherein the output impedance matching circuit 15 is adapted to perform output impedance matching with respect to the signal in the first frequency band of the FET 11 and achieve reactance termination with respect to a second harmonic and a third harmonic. Incidentally, it is merely an example that the input impedance matching circuit 14 performs reactance termination with respect to the second harmonic and the output impedance matching circuit 15 performs reactance termination with respect to the second harmonic and the third harmonic; the input impedance matching circuit 14 and the output impedance matching circuit 15 may also performs reactance termination with respect to further higher harmonic.

Similarly, the other amplifier circuits 20, 50, 70 include a FET 21, a FET 51 and a FET 51 (each being an amplifying element) respectively, and have an input impedance matching circuit 24, an input impedance matching circuit 54 and an input impedance matching circuit 74 (each having the same configuration as that of the input impedance matching circuit 14) arranged in the pre-stage of the FET 21, the FET 51 and the FET 51 respectively. Further, the other amplifier circuits 20, 50, 70 have an output impedance matching circuit 25, an output impedance matching circuit 55 and an output impedance matching circuit 75 (each having the same configuration as that of the output impedance matching circuit 15) arranged in the rear-stage of the FET 21, the FET 51 and the FET 51 respectively.

The input impedance matching circuits 14, 24, 54, 74 are each designed such that the impedance when viewing the side of the signal source from the FET 11, 21, 51, 71 is equal to the signal source impedance $Z_{ST1}$ of the FET 11, 21, 51, 71 which achieve the maximum power added efficiency of the FET 11, 21, 51, 71. Further, the output impedance matching circuits 15, 25, 55, 75 are each designed such that the impedance when viewing the side of the load from the FET 11, 21, 51, 71 is equal to the load impedance $Z_{LT1}$ of the FET 11, 21, 51, 71 which achieve the maximum power added efficiency of the FET 11, 21, 51, 71.

Incidentally, the input impedance matching circuits 14, 24, 54, 74 and the output impedance matching circuits 15, 25, 55, 75 are each formed by a distributed constant circuit such as a microstrip line, for example.

Second Embodiment

Figure 2:
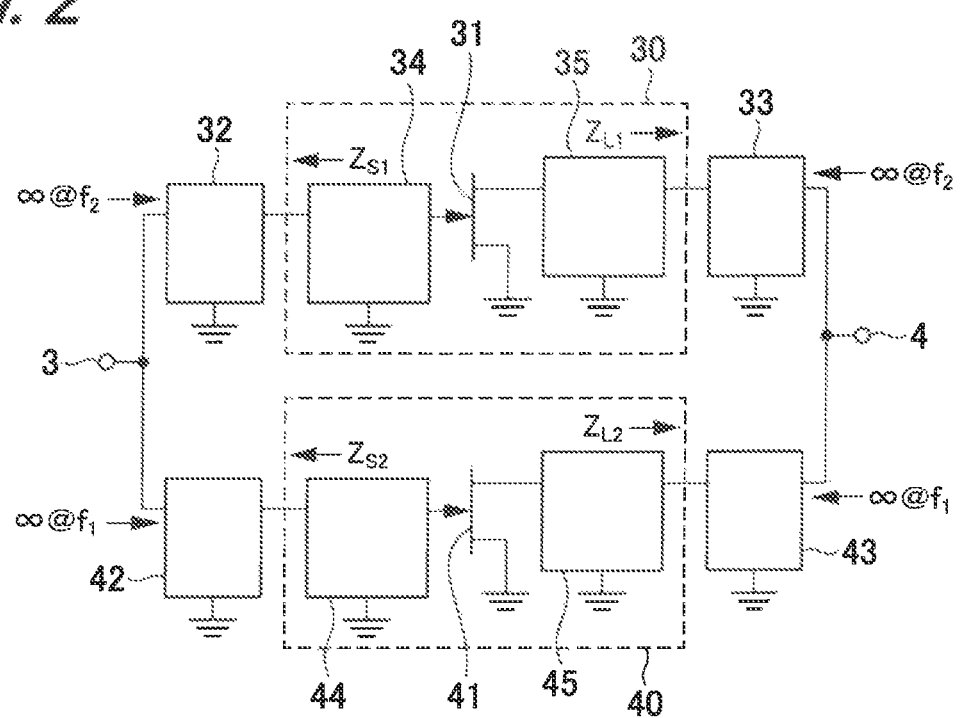
FIG. 2 is a schematic diagram showing the configuration of an amplifier according to a second embodiment of the present invention, and is a schematic circuit diagram showing a dual-band amplifier configured by two amplifier circuits.

FIG. 2 is a schematic diagram showing the configuration of an amplifier according to a second embodiment of the present invention, and is a schematic circuit diagram showing a dual-band amplifier configured by two transistor amplifier circuits (which will each be simply referred to as an "amplifier circuit" hereinafter). As shown in FIG. 2, the dual-band amplifier includes a signal input terminal 3 and a signal output terminal 4. Further, the dual-band amplifier has two amplifier circuits 30, 40. The first amplifier circuit 30 is provided with, in an input signal dividing part thereof (which corresponds to the input side of the first amplifier circuit 30), an input-side blocking circuit 32 adapted to block the signal in a second frequency band. Further, the first amplifier circuit 30 is provided with, in an output signal combining part thereof (which corresponds to the output side of the first amplifier circuit 30), an output-side blocking circuit 33 adapted to block the signal in the second frequency band. Similarly, the second amplifier circuit 40 is provided with, in an input signal dividing part and an output signal combining part thereof, an input-side blocking circuit 42 and an output-side blocking circuit 43 adapted to block the signal in the first frequency band.

Of the signals in the two frequency bands applied to the dual-band amplifier from the signal input terminal 3, the signal in the first frequency band is inputted into the first amplifier circuit 30 through the input-side blocking circuit 32 which blocks the signal in the second frequency band. The signal in the first frequency band amplified by the first amplifier circuit 30 is outputted from the signal output terminal 4 through the output-side blocking circuit 33 which blocks the signal in the second frequency band. At this time, the impedance when viewing the input-side blocking circuit 32 (which blocks the signal in the second frequency band) from the signal input terminal 3 is open for the second frequency band. Further, the impedance when viewing the output-side blocking circuit 33 (which blocks the signal in the second frequency band) from the signal output terminal 4 is also open for the second frequency band.

Of the signals in the two frequency bands applied to the dual-band amplifier from the signal input terminal 3, the signal in the second frequency band is inputted into the second amplifier circuit 40 through the input-side blocking circuit 42 (which blocks the signal in the first frequency band) and is amplified by the second amplifier circuit 40.

Further, the signal in the second frequency band is outputted from the signal output terminal 4 of the dual-band amplifier through the output-side blocking circuit 43 which blocks the signal in the first frequency band. The impedance when viewing the input-side blocking circuit 42 and the output-side blocking circuit 43 (which both block the signal in the first frequency band) respectively from the signal input terminal 3 and the signal output terminal 4 is open for the first frequency band.

The first amplifier circuit 30 includes a FET 31 (which is an amplifying element), an input impedance matching circuit arranged on the input side of the FET 31, and an output impedance matching circuit 35 arranged on the output side of the FET 31. The input impedance matching circuit 34 and the output impedance matching circuit 35 include the input-side blocking circuit 32 and the output-side blocking circuit 33 (which both block the signal in the second frequency band), and are adapted to perform input/output impedance matching with respect to the transistor FET 31 (which is an amplifying element).

To be specific, the input impedance matching circuit 34 is designed such that the impedance when viewing the side of the signal source from the FET 31 is equal to a signal source impedance $Z_{ST1}$ of the FET 31 which achieves the maximum power added efficiency of the FET 31. Further, the output impedance matching circuit 35 is designed such that the impedance when viewing the side of the load from the FET 31 is equal to a load impedance $Z_{LT1}$ of the FET 31 which achieves the maximum power added efficiency of the FET 31. In other words, the input impedance matching circuit 34 and the output impedance matching circuit 35 perform a function for converting a signal source impedance $Z_{S1}$ and a load impedance $Z_{L1}$ when viewing the input-side blocking circuit 32 and the output-side blocking circuit 33 from the first amplifier circuit 30 respectively into the signal source impedance $Z_{ST1}$ and the load impedance $Z_{LT1}$ of the FET 31 (which both achieve the maximum power added efficiency of the FET 31).

The second amplifier circuit 40 includes a FET 41 (which is an amplifying element), an input impedance matching circuit arranged on the input side of the FET 41, and an output impedance matching circuit 45 arranged on the output side of the FET 41. The input impedance matching circuit 44 and the output impedance matching circuit 45 convert a signal source impedance $Z_{S2}$ and a load impedance $Z_{L2}$ when viewing the input-side blocking circuit 42 and the output-side blocking circuit (which both block the signal in the first frequency band) from the amplifier circuit 40 respectively into the signal source impedance $Z_{ST2}$ and the load impedance $Z_{LT2}$ of the FET 41 (which both achieve the maximum power added efficiency of the FET 41).

By designing the frequency blocking circuits and the impedance matching circuits of the amplifier circuits in the aforesaid manner, it is possible to obtain a concurrent dual-band power amplifier adapted to achieve maximum power added efficiency characteristics for the signal in each frequency band. Further, as described above, since the matching circuits of the amplifier circuit to amplify the signal in each frequency band can be independently designed, it is possible to freely select the type of the FET and the gate width; and also, since accuracy of optimal design relevant to power efficiency and output power becomes higher, it becomes easy to achieve high efficiency power characteristics. Further, in the amplifier of the present invention, since the signal in each frequency band is amplified by an independent amplifier circuit, no distortion such as intermodulation, cross modulation and the like will be caused between signals in different frequency bands.

Incidentally, although the present embodiment is described based on a case where the transistor amplifier circuit is a single-stage amplifier, obviously the present invention also include a case where the transistor amplifier circuit is a multi-stage amplifier circuit. Further, the amplification operation of the transistor(s) is not limited to a specific mode (such as Class-A, Class-B, Class-C, Class-F, Inverse Class-F, Class-E, harmonic reactance termination amplifier, Doherty amplifier or the like)

Here, according to a third embodiment, as characteristics of the dual-band amplifier by which signals of two frequency ($f_1$, $f_2$) are concurrently amplified, an output power (dBm) $P_{out}$ with respect to an input power (dBm), a power added efficiency (PAE) % with respect to the input power (dBm), and a drain efficiency $\eta$(%) will be described below with reference to FIG. 3.

The first amplifier circuit 30 amplifies the signal in the first frequency band ($f_1$), and the second amplifier circuit amplifies the signal in the second frequency band ($f_2$). Here, the frequency of the signal in the first frequency band ($f_1$) is 4.5 GHz, and the frequency of the signal in the second frequency band ($f_2$) is 8.5 GHz.

Figure 3A:
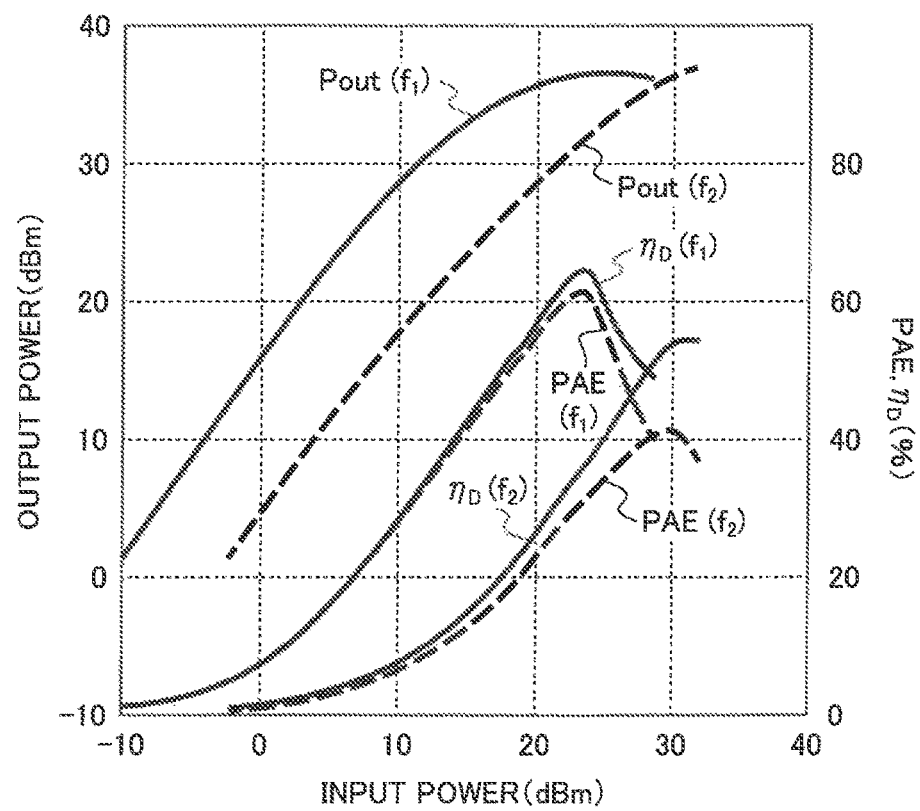

FIG. 3A shows an output power $P_{out}$ ($f_1$) of a signal in the first frequency band ($f_1$) and an output power $P_{out}$ ($f_2$) of a signal in the second frequency band ($f_2$), a power added efficiency PAE ($f_1$) of the signal in the first frequency band ($f_1$) and a power added efficiency PAE ($f_2$) of the signal in the second frequency band ($f_2$), and a drain efficiency $\eta_D$($f_1$) of the signal in the first frequency band ($f_1$) and a drain efficiency $\eta_D$ ($f_2$) of the signal in the second frequency band ($f_2$). In FIG. 3A, the solid line represents characteristics of the signal in the first frequency band ($f_1$), and the broken line represents characteristics of the signal in the second frequency band ($f_2$).

The power added efficiencies PAE ($f_1$) and PAE ($f_2$) are obtained from [(output power $P_{out}$–input power $P_{in}$)/amplifier power $P_{DC}$]". The amplifier power $P_{DC}$ represents DC power supplied to the amplifying element. Further, the drain efficiencies $\eta_D$ ($f_1$) and $\eta_D$ ($f_2$) are obtained from [output power $P_{out}$/amplifier power $P_{DC}$]".

As can be known from FIG. 3A, the output power $P_{out}$ with respect to the input power $P_{in}$ have sufficient level for the signals in the first and second frequency bands ($f_2$, $f_2$), and are excellent characteristics with respect to the power added efficiencies PAE and the drain efficiencies $\eta_D$.

Figure 3B:
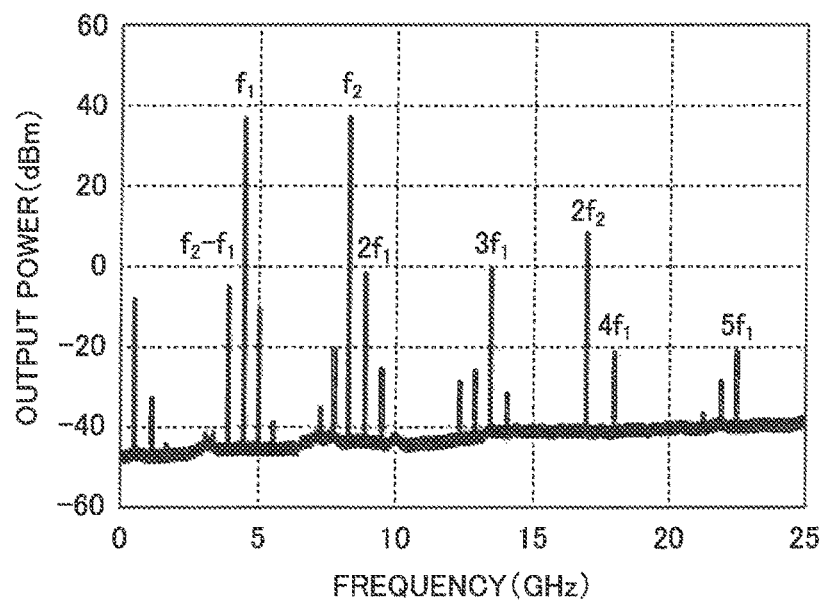

FIG. 3B shows each frequency component included the output power (dBm). Incidentally, in FIG. 3B, the output power (dBm) spectrum is obtained in a condition where the input power $P_{in}$ of the signal in the first frequency band ($f_1$) is 29 dBm and the input power $P_{in}$ of the signal in the second frequency band ($f_2$) is 32 dBm.

As can be known from FIG. 3B, harmonics $2f_1$, $3f_1$, . . . of the first frequency $f_1$ are sufficiently suppressed, and harmonics $2f_2$, of the second frequency $f_2$ are also sufficiently suppressed. It is also known that frequency components of the difference between the first frequency $f_1$ and the second frequency $f_2$, such as [$f_2$–$f_1$], are sufficiently small compared with the frequencies $f_1$, and also, intermodulation distortion is sufficiently suppressed.

Third Embodiment

Figure 4:
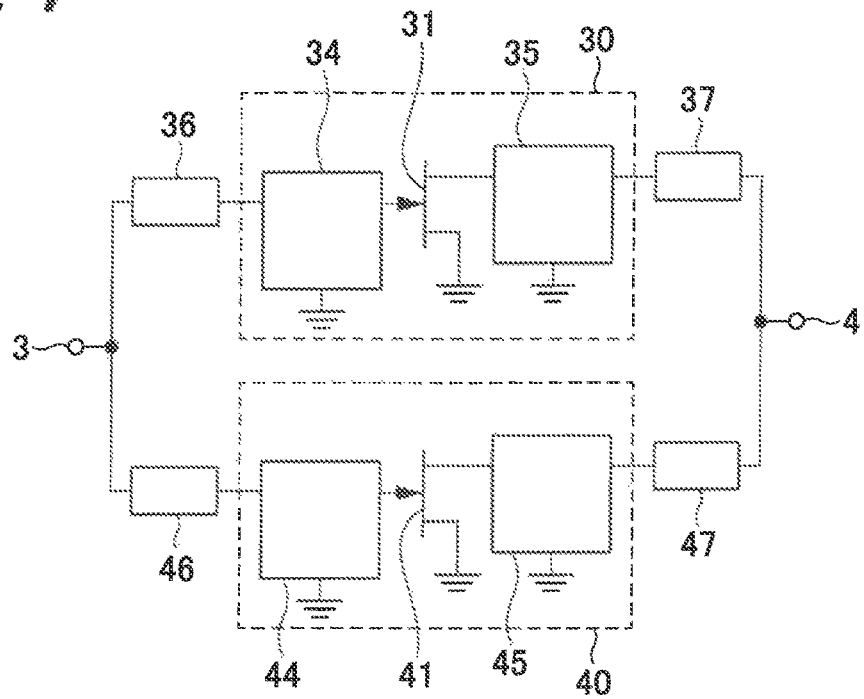
FIG. 4 is a schematic diagram showing the configuration of an amplifier according to a third embodiment of the present invention, and is a schematic circuit diagram showing a dual-band amplifier configured by two amplifier circuits.

FIG. 4 is a schematic diagram showing the configuration of an amplifier according to a third embodiment of the present invention, and is a schematic circuit diagram showing a dual-band amplifier configured by two transistor amplifier circuits (which will each be simply referred to as an "amplifier circuit" hereinafter). Note that, the same components shown in FIG. 4 are denoted by the same numerals as of FIG. 2 and the explanation thereof will not be repeated.

A first amplifier circuit 30 is provided with, in an input signal dividing part thereof (which corresponds to the input side of the first amplifier circuit 30), an input-side blocking circuit 36 adapted to block the signal in a second frequency band. The input-side blocking circuit 36 is a circuit whose parallel resonance frequency falls in the second frequency band, and is connected in series with the amplifier circuit 30. Since the impedance of a parallel resonance circuit is close to open at the parallel resonance frequency, by connecting the input-side blocking circuit 36 in series with the amplifier circuit 30, the signal in the second frequency band can be blocked from being inputted into the first amplifier circuit 30.

Further, the first amplifier circuit 30 is provided with, in an output signal combining part thereof (which corresponds to the output side of the first amplifier circuit 30), an output-side blocking circuit 37 adapted to block the signal in the second frequency band. Similar to the input-side blocking circuit 36, the output-side blocking circuit 37 is also a circuit whose parallel resonance frequency falls in the second frequency band, and is connected in series with the amplifier circuit 30.

Similarly, the second amplifier circuit 40 is provided with, in an input signal dividing part and an output signal combining part thereof, an input-side blocking circuit 46 and an output-side blocking circuit 47 adapted to block the signal in the first frequency band.

Of the signals in the two frequency bands applied to the dual-band amplifier from the signal input terminal 3, the signal in the first frequency band is inputted into the first amplifier circuit 30 through the input-side blocking circuit 36. The signal in the first frequency band amplified by the first amplifier circuit 30 is outputted from the signal output terminal 4 through the output-side blocking circuit 37. The impedance when viewing the input-side blocking circuit 36 (which blocks the signal in the second frequency band) from the signal input terminal 3 is open for the second frequency band. Further, the impedance when viewing the output-side blocking circuit 37 (which blocks the signal in the second frequency band) from the signal output terminal 4 is also open.

Of the signals in the two frequency bands applied to the dual-band amplifier from the signal input terminal 3, the signal in the second frequency band is inputted into the second amplifier circuit 40 through the input-side blocking circuit 46 (which blocks the signal in the first frequency band) and amplified by the second amplifier circuit 40. Further, the signal in the second frequency band is outputted from the signal output terminal 4 of the dual-band amplifier through the output-side blocking circuit 47 which blocks the signal in the first frequency band. The impedance when viewing the input-side blocking circuit 46 and the output-side blocking circuit 47 (which both block the signal in the first frequency band) respectively from the signal input terminal 3 and the signal output terminal 4 is open for the first frequency band.

The first amplifier circuit 30 includes a FET 31 (which is an amplifying element), an input impedance matching circuit arranged on the input side of the FET 31, and an output impedance matching circuit 35 arranged on the output side of the FET 31. The input impedance matching circuit 34 and the output impedance matching circuit 35 include the input-side blocking circuit 36 and the output-side blocking circuit 37 (which both block the signal in the second frequency band), and are adapted to perform input/output impedance matching with respect to the transistor FET 31 (which is an amplifying element).

To be specific, the input impedance matching circuit 34 is designed such that the impedance when viewing the side of the signal source from the FET 31 is equal to a signal source impedance $Z_{ST1}$ of the FET 31 which achieves the maximum power added efficiency of the FET 31. Further, the output impedance matching circuit 35 is designed such that the impedance when viewing the side of the load from the FET 31 is equal to a load impedance $Z_{LT1}$ of the FET 31 which achieves the maximum power added efficiency of the FET 31. In other words, the input impedance matching circuit 34 and the output impedance matching circuit 35 perform a function for converting a signal source impedance $Z_{S1}$ and a load impedance $Z_{L1}$ when viewing the input-side blocking circuit 36 and the output-side blocking circuit 37 from the first amplifier circuit 30 respectively into the signal source impedance $Z_{ST1}$ and the load impedance $Z_{LT1}$ of the FET 31 (which both achieve the maximum power added efficiency of the FET 31).

The second amplifier circuit 40 includes a FET 41 (which is an amplifying element), an input impedance matching circuit arranged on the input side of the FET 41, and an output impedance matching circuit 45 arranged on the output side of the FET 41. The input impedance matching circuit 44 and the output impedance matching circuit 45 convert a signal source impedance $Z_{S2}$ and a load impedance $Z_{L2}$ when viewing the input-side blocking circuit 46 and the output-side blocking circuit (which both block the signal in the first frequency band) from the amplifier circuit 40 respectively into the signal source impedance $Z_{ST2}$ and the load impedance $Z_{LT2}$ of the FET 41 (which both achieve the maximum power added efficiency of the FET 41).

By designing the frequency blocking circuits and the impedance matching circuits of the amplifier circuits in the aforesaid manner, it is possible to obtain a concurrent dual-band power amplifier adapted to achieve maximum power added efficiency characteristics for the signal in each frequency band.

Fourth Embodiment

Figure 5:
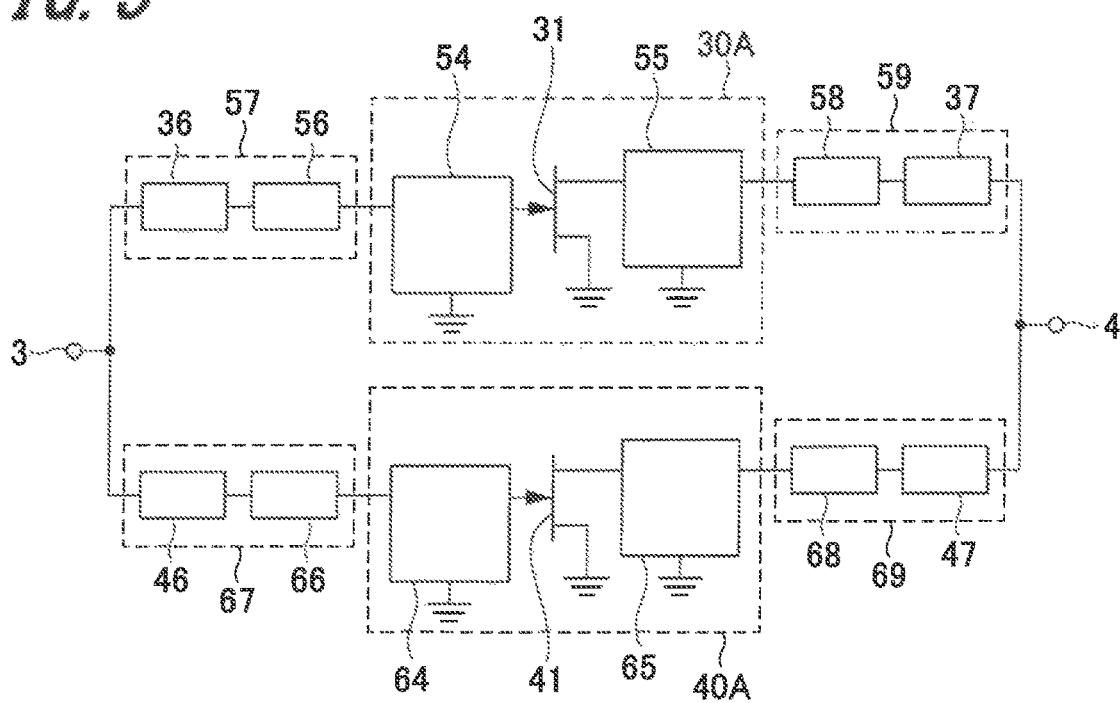
FIG. 5 is a schematic diagram showing the configuration of an amplifier according to a fourth embodiment of the present invention, and is a schematic circuit diagram showing a dual-band amplifier configured by two amplifier circuits.

FIG. 5 is a schematic diagram showing the configuration of an amplifier according to a fourth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 5 are denoted by the same numerals as of FIG. 2 and the explanation thereof will not be repeated.

Note that, in FIGS. 5 to 13, a circuit denoted by a reference numeral ending with A, B, C or D (such as amplifier circuit 30A, amplifier circuit 40A or the like) may have different configuration from the original circuit (such as the amplifier circuit 30, the amplifier circuit 40 or the like).

The dual-band amplifier has two amplifier circuits 30A, 40A. The first amplifier circuit 30A is provided with, in an input signal dividing part thereof (which corresponds to the input side of the first amplifier circuit 30A), an input-side blocking circuit 57 adapted to block the signal in a second frequency band. The input-side blocking circuit 57 includes an input-side blocking circuit 36 and a circuit element 56, wherein the input-side blocking circuit 36 is a circuit whose parallel resonance frequency falls in the second frequency band, and the circuit element 56 is adapted to cancel a series reactance component of the input-side blocking circuit 36 in a first frequency band. The input-side blocking circuit 36 and the circuit element 56 are connected to each other in series to form the input-side blocking circuit 57.

Further, the first amplifier circuit 30A is provided with, in an output signal combining part thereof (which corresponds to the output side of the first amplifier circuit 30A), an output-side blocking circuit 59 adapted to block the signal in the second frequency band. The output-side blocking circuit 59 includes an output-side blocking circuit 37 and a circuit element 58, wherein the output-side blocking circuit is a circuit whose parallel resonance frequency falls in the second frequency band, and the circuit element 58 is adapted to cancel a series reactance component of the output-side blocking circuit 37 in the first frequency band. The output-side blocking circuit 37 and the circuit element 58 are connected to each other in series to form the output-side blocking circuit 59.

Similarly, the second amplifier circuit 40A is provided with, in an input signal dividing part thereof (which corresponds to the input side of the second amplifier circuit 40A), an input-side blocking circuit 67 adapted to block the signal in the first frequency band. The input-side blocking circuit 67 includes an input-side blocking circuit 46 and a circuit element 66, wherein input-side blocking circuit 46 is a circuit whose parallel resonance frequency falls in the first frequency band, and the circuit element 66 is adapted to cancel a series reactance component of the input-side blocking circuit 46 in the second frequency band. The input-side blocking circuit 46 and the circuit element 66 are connected to each other in series to form the input-side blocking circuit 67.

Further, the second amplifier circuit 40A is provided with, in an output signal combining part thereof (which corresponds to the output side of the second amplifier circuit 60), an output-side blocking circuit 69 adapted to block the signal in the first frequency band. The output-side blocking circuit 69 includes an output-side blocking circuit 47 and a circuit element 68, wherein output-side blocking circuit 47 is a circuit whose parallel resonance frequency falls in the first frequency band, and the circuit element 68 is adapted to cancel a series reactance component of the output-side blocking circuit 47 in the second frequency band. The output-side blocking circuit 47 and the circuit element 68 are connected to each other in series to form the output-side blocking circuit 69.

Of the signals in the two frequency bands applied to the dual-band amplifier from the signal input terminal 3, the signal in the first frequency band is inputted into the first amplifier circuit 30A through the input-side blocking circuit 57. The signal in the first frequency band amplified by the first amplifier circuit 30A is outputted from the signal output terminal 4 through the output-side blocking circuit 59. The impedance when viewing the input-side blocking circuit 57 (which blocks the signal in the second frequency band) from the signal input terminal 3 is open for second frequency band. Further, the impedance when viewing the output-side blocking circuit 59 (which blocks the signal in the second frequency band) from the signal output terminal 4 is also open for second frequency band.

Of the signals in the two frequency bands applied to the dual-band amplifier from the signal input terminal 3, the signal in the second frequency band is inputted into the second amplifier circuit 40A through the input-side blocking circuit 67 (which blocks the signal in the first frequency band) and amplified by the second amplifier circuit 40A. The signal in the second frequency band is outputted from the signal output terminal 4 of the dual-band amplifier through the output-side blocking circuit 69 (which blocks the signal in the first frequency band). The impedance when viewing the input-side blocking circuit 67 and the output-side blocking circuit 69 (which both block the signal in the first frequency band) respectively from the signal input terminal 3 and the signal output terminal 4 is open for the first frequency band.

The first amplifier circuit 30A includes a FET 51 (which is an amplifying element), an input impedance matching circuit arranged on the input side of the FET 51, and an output impedance matching circuit 55 arranged on the output side of the FET 51. The input impedance matching circuit 54 and the output impedance matching circuit 55 include the input-side blocking circuit 57 and the output-side blocking circuit 59 (which both block the signal in the second frequency band), and are adapted to perform input/output impedance matching with respect to the transistor FET 51 (which is an amplifying element).

To be specific, the input impedance matching circuit 54 is designed such that the impedance when viewing the side of the signal source from the FET 51 is equal to a signal source impedance $Z_{ST1}$ of the FET 51 which achieves the maximum power added efficiency of the FET 51. Further, the output impedance matching circuit 55 is designed such that the impedance when viewing the side of the load from the FET 51 is equal to a load impedance $Z_{LT1}$ of the FET 51 which achieves the maximum power added efficiency of the FET 51. In other words, the input impedance matching circuit 54 and the output impedance matching circuit 55 perform a function for converting a signal source impedance $Z_{S1}$ and a load impedance $Z_{L1}$ when viewing the input-side blocking circuit 57 and the output-side blocking circuit 59 from the first amplifier circuit 30A respectively into the signal source impedance $Z_{ST1}$ and the load impedance $Z_{LT1}$ of the FET 51 (which both achieve the maximum power added efficiency of the FET 51). Here, since reactance components of the input-side blocking circuit 57 and the output-side blocking circuit 59 (which both block the signal in the second frequency band) are cancelled, the signal source impedance $Z_{S1}$ and the load impedance $Z_{L1}$ viewed from the first amplifier circuit 30A are each 50Ω.

The second amplifier circuit 40A includes a FET 61 (which is an amplifying element), an input impedance matching circuit arranged on the input side of the FET 61, and an output impedance matching circuit 65 arranged on the output side of the FET 41. The input impedance matching circuit 64 and the output impedance matching circuit 65 convert a signal source impedance $Z_{S2}$ and a load impedance $Z_{L2}$ when viewing the input-side blocking circuit 67 and the output-side blocking circuit (which both block the signal in the first frequency band) from the second amplifier circuit 40A respectively into the signal source impedance $Z_{ST2}$ and the load impedance $Z_{LT2}$ of the FET 41 (which both achieve the maximum power added efficiency of the FET 41). Here, since reactance components of the input-side blocking circuit 67 and the output-side blocking circuit (which both block the signal in the first frequency band) are cancelled, the signal source impedance $Z_{S2}$ and the load impedance $Z_{L2}$ viewed from the second amplifier circuit 40A are each 50Ω.

In the present embodiment, the signal source impedance and the load impedance of each of the two amplifier circuits constituting the dual-band amplifier are each 50Ω, which is the standard impedance, and therefore it becomes easy to design and evaluate the impedance matching circuits, so that it is advantageous to enhance performance. By designing the frequency blocking circuits and the impedance matching circuits of the amplifier circuits in the aforesaid manner, it is possible to obtain a concurrent dual-band power amplifier adapted to achieve maximum power added efficiency characteristics for signal in each frequency band.

Fifth Embodiment

In the fifth embodiment of the present invention, the input-side blocking circuit 36 and the output-side blocking circuit 37 of the third and fourth embodiments whose parallel resonance frequency falls into the second frequency band are each formed by an inductor and a capacitor connected in parallel. Further, the input-side blocking circuit 46 and the output-side blocking circuit 47 of the third and fourth embodiments whose parallel resonance frequency falls into the second frequency band are each formed by an inductor and a capacitor connected in parallel.

Sixth Embodiment

Figure 6:
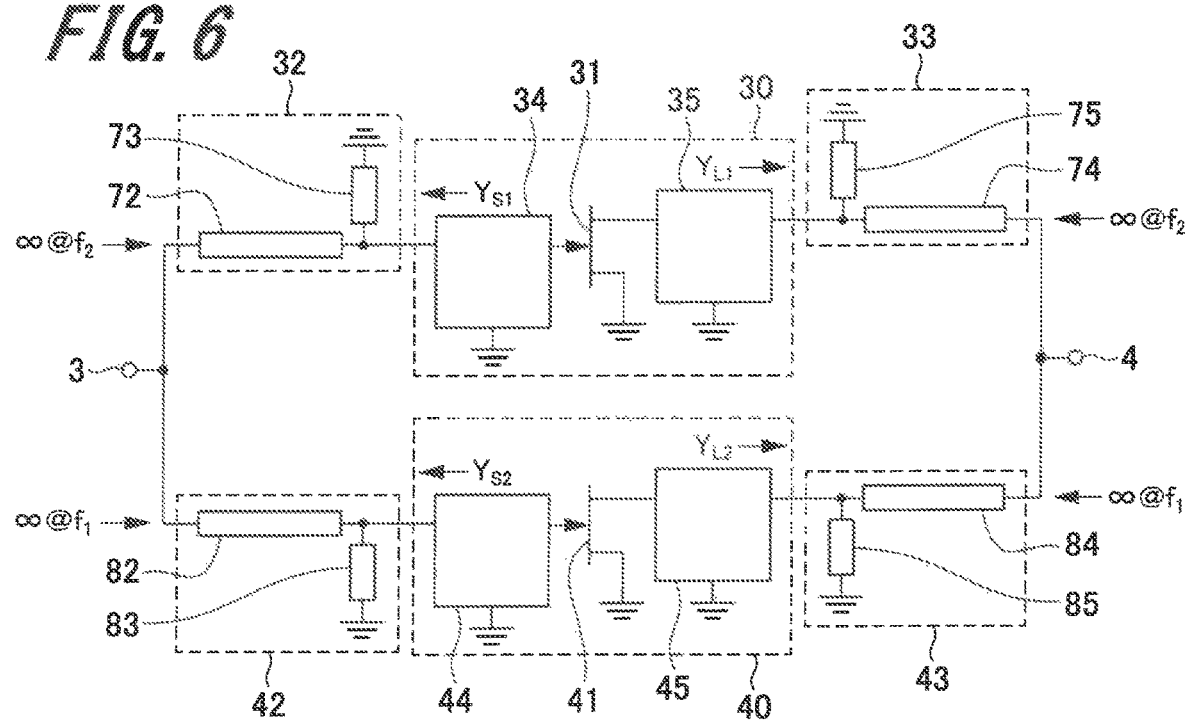
FIG. 6 is a schematic diagram showing the configuration of an amplifier according to a sixth embodiment of the present invention, and is a schematic circuit diagram showing a dual-band amplifier configured by two amplifier circuits.

FIG. 6 is a schematic diagram showing the configuration of an amplifier according to a sixth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 6 are denoted by the same numerals as of FIG. 2 and the explanation thereof will not be repeated.

A first amplifier circuit 30 is provided with, in an input signal dividing part thereof (which corresponds to the input side of the first amplifier circuit 30), an input-side blocking circuit 32 adapted to block the signal in a second frequency band. The input-side blocking circuit 32 has a series transmission line 72 and a parallel circuit 73, wherein the series transmission line 72 is a component whose characteristic impedance is 50Ω and whose length is equal to a quarter of the wavelength of the signal in the second frequency band, and the parallel circuit 73 is adapted to short-circuit the signal in the second frequency band. The transmission line 72 is connected in series with the main line, and the parallel circuit 73 is connected in parallel to the main line to form the input-side blocking circuit 32.

Further, the first amplifier circuit 30 is provided with, in an output signal combining part thereof (which corresponds to the output side of the first amplifier circuit 30), an output-side blocking circuit 33 adapted to block the signal in the second frequency band. The output-side blocking circuit 32 has a series transmission line 74 and a parallel circuit 75, wherein the series transmission line 74 is a component whose characteristic impedance is 50Ω and whose length is equal to a quarter of the wavelength of the signal in the second frequency band, and the parallel circuit 75 is adapted to short-circuit the signal in the second frequency band. The transmission line 74 is connected in series with the main line, and the parallel circuit 75 is connected in parallel to the main line to form the output-side blocking circuit 33.

Similarly, the second amplifier circuit 40 is provided with, in an input signal dividing part thereof (which corresponds to the input side of the second amplifier circuit 40), an input-side blocking circuit 42 adapted to block the signal in a first frequency band. The input-side blocking circuit 42 has a series transmission line 82 and a parallel circuit 83, wherein the series transmission line 82 is a component whose characteristic impedance is 50Ω and whose length is equal to a quarter of the wavelength of the signal in the first frequency band, and the parallel circuit 73 is adapted to short-circuit the signal in the first frequency band. The transmission line 82 is connected in series with the main line, and the parallel circuit 83 is connected in parallel to the main line to form the input-side blocking circuit 42.

Further, the second amplifier circuit 40 is provided with, in an output signal combining part thereof (which corresponds to the output side of the second amplifier circuit 40), an output-side blocking circuit 43 adapted to block the signal in the first frequency band. The output-side blocking circuit 43 has a series transmission line 84 and a parallel circuit 85, wherein the series transmission line 84 is a component whose characteristic impedance is 50Ω and whose length is equal to a quarter of the wavelength of the signal in the first frequency band, and the parallel circuit 85 is adapted to short-circuit the signal in the first frequency band. The transmission line 84 is connected in series with the main line, and the parallel circuit 85 is connected in parallel to the main line to form the output-side blocking circuit 43.

Of the signals in the two frequency bands applied to the dual-band amplifier from the signal input terminal 3, the signal in the first frequency band is inputted into the first amplifier circuit 30 through the input-side blocking circuit 32. The signal in the first frequency band amplified by the first amplifier circuit 30 is outputted from the signal output terminal 4 through the output-side blocking circuit 33. The impedance when viewing the input-side blocking circuit 32 (which blocks the signal in the second frequency band) from the signal input terminal 4 is open for the second frequency band. Further, the impedance when viewing the output-side blocking circuit 33 (which blocks the signal in the second frequency band) from the signal output terminal 4 is also open for the second frequency band.

Of the signals in the two frequency bands applied to the dual-band amplifier from the signal input terminal 3, the signal in the second frequency band is inputted into the second amplifier circuit 40 through the input-side blocking circuit 42 (which blocks the signal in the first frequency band) and is amplified by the second amplifier circuit 40. Further, the signal in the second frequency band is outputted from the signal output terminal 4 of the dual-band amplifier through the output-side blocking circuit 43 which blocks the signal in the first frequency band. The impedance when viewing the input-side blocking circuit 42 and the output-side blocking circuit 43 (which both block the signal in the first frequency band) respectively from the signal input terminal 3 and the signal output terminal 4 is open for the first frequency band.

The first amplifier circuit 30 includes a FET 31 (which is an amplifying element), an input impedance matching circuit arranged on the input side of the FET 31, and an output impedance matching circuit 35 arranged on the output side of the FET 31. The input impedance matching circuit 34 and the output impedance matching circuit 35 include the input-side blocking circuit 32 and the output-side blocking circuit 33 (which both block the signal in the second frequency band), and are adapted to perform input/output impedance matching with respect to the transistor FET 31 (which is an amplifying element).

To be specific, the input impedance matching circuit 34 is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35 is designed such that the admittance when viewing the side of the load from the FET 31 is equal to a load admittance $Y_{LT1}$ of the FET 31 which achieves the maximum power added efficiency of the FET 31. In other words, the input impedance matching circuit 34 and the output impedance matching circuit 35 perform a function for converting a signal source admittance $Y_{S1}$ and a load admittance $Y_{L1}$ when viewing the input-side blocking circuit 32 and the output-side blocking circuit 33 from the first amplifier circuit 30 respectively into the signal source admittance $Y_{ST1}$ and the load admittance $Y_{LT1}$ of the FET 31 (which both achieve the maximum power added efficiency of the FET 31).

The second amplifier circuit 40 includes a FET 41 (which is an amplifying element), an input impedance matching circuit arranged on the input side of the FET 41, and an output impedance matching circuit 45 arranged on the output side of the FET 41. The input impedance matching circuit 44 and the output impedance matching circuit 45 convert a signal source admittance $Y_{S2}$ and a load admittance $Y_{L2}$ when viewing the input-side blocking circuit 42 and the output-side blocking circuit (which both block the signal in the first frequency band) from the second amplifier circuit 40 respectively into the signal source admittance $Y_{ST2}$ and the load admittance $Y_{LT2}$ of the FET 41 (which both achieve the maximum power added efficiency of the FET 41).

Incidentally, each of the parallel circuits 73, 75, 83, adapted to short-circuit signals is not limited to a specific circuit/element, such as a transmission line with opened tip, a radial line, and a series resonance circuit formed by an inductor and a capacitive element.

By designing the frequency blocking circuits and the impedance matching circuits of the amplifier circuits in the aforesaid manner, it is possible to obtain a concurrent dual-band power amplifier adapted to achieve maximum power added efficiency characteristics for the signal in each frequency band.

Seventh Embodiment

Figure 7:
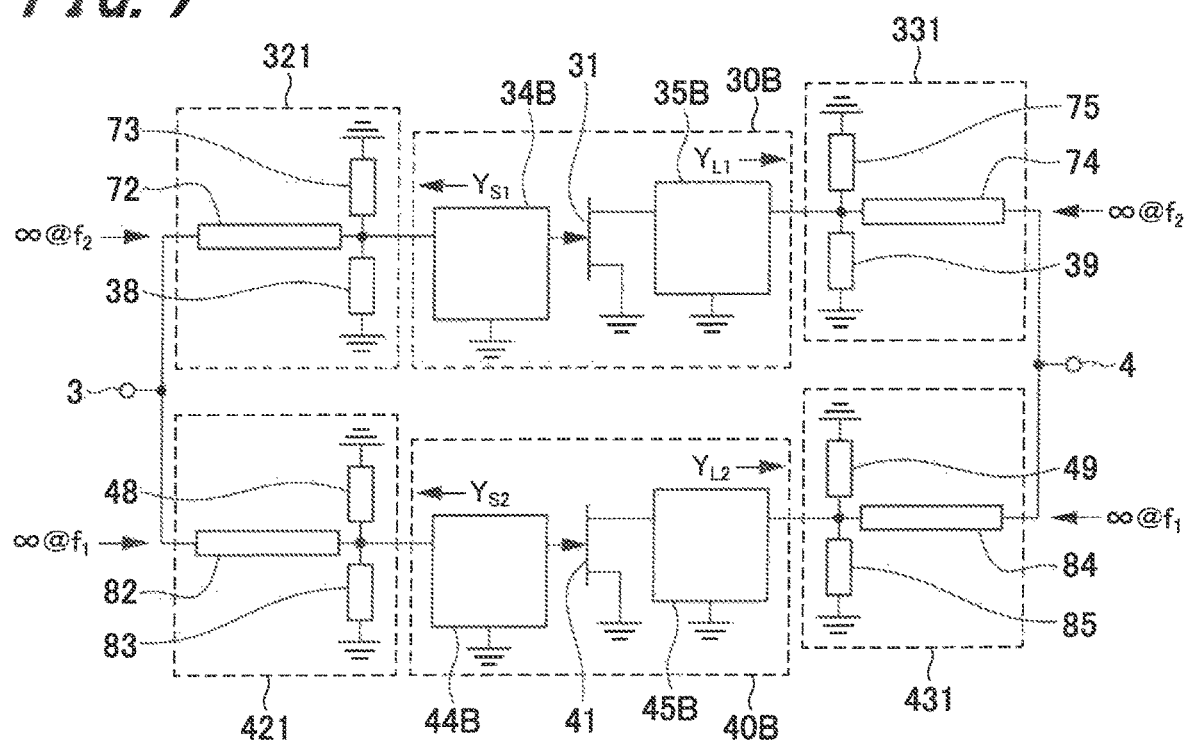
FIG. 7 is a schematic diagram showing the configuration of an amplifier according to a seventh embodiment of the present invention, and is a schematic circuit diagram showing a dual-band amplifier configured by two amplifier circuits.

FIG. 7 is a schematic diagram showing the configuration of an amplifier according to a seventh embodiment of the present invention, and is a schematic circuit diagram showing a dual-band amplifier configured by two transistor amplifier circuits (which will each be simply referred to as an "amplifier circuit" hereinafter). Note that, the same components shown in FIG. 7 are denoted by the same numerals as of FIG. 2 and the explanation thereof will not be repeated.

A first amplifier circuit 30B is provided with, in an input signal dividing part thereof (which corresponds to the input side of the first amplifier circuit 30B) an input-side blocking circuit 321 adapted to block the signal in a second frequency band. The input-side blocking circuit 321 has a series transmission line 72, a parallel circuit 73, and a circuit 38, wherein the series transmission line 72 is a component whose characteristic impedance is 50Ω and whose length is equal to a quarter of the wavelength of the signal in the second frequency band, the parallel circuit 73 is adapted to short-circuit the signal in the second frequency band, and the circuit 38 is adapted to cancel a susceptance component of the parallel circuit 73 in the first frequency band (the circuit 38 will be referred to as "cancellation circuit 38" hereinafter). The transmission line 72 is connected in series with the main line, and the parallel circuit 73 and the cancellation circuit 38 are connected in parallel to the main line to form the input-side blocking circuit 321.

Further, the first amplifier circuit 30B is provided with, in an output signal combining part thereof (which corresponds to the output side of the first amplifier circuit 30B), an output-side blocking circuit 331 adapted to block the signal in the second frequency band. The output-side blocking circuit 331 has a series transmission line 74, a parallel circuit 75, and a circuit 39, wherein the series transmission line 74 is a component whose characteristic impedance is 50Ω and whose length is equal to a quarter of the wavelength of the signal in the second frequency band, the parallel circuit is adapted to short-circuit the signal in the second frequency band, and the circuit 39 is adapted to cancel a susceptance component of the parallel circuit 75 in the first frequency band (the circuit 39 will be referred to as "cancellation circuit 39" hereinafter). The transmission line 74 is connected in series with the main line, and the parallel circuit 75 and the cancellation circuit 39 are connected in parallel to the main line to form the output-side blocking circuit 331.

Similarly, the second amplifier circuit 40B is provided with, in an input signal dividing part thereof, an input-side blocking circuit 421 adapted to block the signal in a first frequency band. The input-side blocking circuit 421 has a series transmission line 82, a parallel circuit 83, and a circuit 48, wherein the series transmission line 82 is a component whose characteristic impedance is 50Ω and whose length is equal to a quarter of the wavelength of the signal in the first frequency band, the parallel circuit 83 is adapted to short-circuit the signal in the first frequency band, and the circuit 48 is adapted to cancel a susceptance component of the parallel circuit 83 in the second frequency band (the circuit 48 will be referred to as "cancellation circuit 48" hereinafter).

Further, the second amplifier circuit 40B is provided with, in an output signal combining part thereof, an output-side blocking circuit 431 adapted to block the signal in the first frequency band. The output-side blocking circuit 431 has a series transmission line 84, a parallel circuit 85, and a circuit 49, wherein the series transmission line 82 is a component whose characteristic impedance is 50Ω and whose length is equal to a quarter of the wavelength of the signal in the first frequency band, the parallel circuit 85 is adapted to short-circuit the signal in the first frequency band, and the circuit 49 is adapted to cancel a susceptance component of the parallel circuit 85 in the second frequency band (the circuit 49 will be referred to as "cancellation circuit 49" hereinafter).

Of the signals in the two frequency bands applied to the dual-band amplifier from the signal input terminal 3, the signal in the first frequency band is inputted into the first amplifier circuit 30B through the input-side blocking circuit 321. The signal in the first frequency band amplified by the first amplifier circuit 30B is outputted from the signal output terminal 4 through the output-side blocking circuit 331. The impedance when viewing the input-side blocking circuit 321 (which blocks the signal in the second frequency band) from the signal input terminal 3 is open for the second frequency band. Further, the impedance when viewing the output-side blocking circuit 331 (which blocks the signal in the second frequency band) from the signal output terminal 4 is also open for the second frequency band.

Of the signals in the two frequency bands applied to the dual-band amplifier from the signal input terminal 3, the signal in the second frequency band is inputted into the second amplifier circuit 40B through the input-side blocking circuit 421 (which blocks the signal in the first frequency band) and amplified by the second amplifier circuit 40B. The signal in the second frequency band is outputted from the signal output terminal 4 of the dual-band amplifier through the output-side blocking circuit 431 (which blocks the signal in the first frequency band). The impedance when viewing the input-side blocking circuit 421 and the output-side blocking circuit 431 (which both block the signal in the first frequency band) respectively from the signal input terminal 3 and the signal output terminal 4 is open for the first frequency band.

The first amplifier circuit 30B includes a FET 31 (which is an amplifying element), an input impedance matching circuit 34B arranged on the input side of the FET 31, and an output impedance matching circuit 35B arranged on the output side of the FET 31. The input impedance matching circuit 34B and the output impedance matching circuit 35B include the input-side blocking circuit 321 and the output-side blocking circuit 331 (which both block the signal in the second frequency band), and are adapted to perform input/output impedance matching with respect to the transistor FET 31 (which is an amplifying element).

To be specific, the input impedance matching circuit 34B is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35B is designed such that the admittance when viewing the side of the load from the FET 31 is equal to a load admittance $Y_{LT1}$ of the FET 31 which achieves the maximum power added efficiency of the FET 31. In other words, the input impedance matching circuit 34B and the output impedance matching circuit 35B perform a function for converting a signal source admittance $Y_{S1}$ (=1/(50Ω)) and a load admittance $Y_{L1}$ (=1/(50Ω)) when viewing the input-side blocking circuit 321 and the output-side blocking circuit 331 (which both block the signal in the second frequency band) from the first amplifier circuit 30 respectively into the signal source admittance $Y_{ST1}$ and the load admittance $Y_{LT1}$ of the FET 31 (which both achieve the maximum power added efficiency of the FET 31).

The second amplifier circuit 40B includes a FET 41 (which is an amplifying element), an input impedance matching circuit 44B arranged on the input side of the FET 41, and an output impedance matching circuit 45B arranged on the output side of the FET 41. The input impedance matching circuit 44B and the output impedance matching circuit 45B convert a signal source admittance $Y_{S2}$ (=1/(50Ω)) and a load admittance $Y_{L2}$ (=1/(50Ω)) when viewing the input-side blocking circuit 421 and the output-side blocking circuit 431 (which both block the signal in the first frequency band) from the second amplifier circuit 40 respectively into the signal source admittance $Y_{ST2}$ and the load admittance $Y_{LT2}$ of the FET 41 (which both achieve the maximum power added efficiency of the FET 41). In the present embodiment, since the signal source impedance and the load impedance viewed from each amplifier circuit are each 50Ω, it becomes easy to design and evaluate each amplifier circuit.

Incidentally, each of the parallel circuits 73, 75, 83, adapted to short-circuit signals is not limited to a specific circuit/element, such as a transmission line with opened tip, a radial line, and a serial resonance circuit formed by an inductor and a capacitive element. Each of the cancellation circuits 38, 39, 48, 49 adapted to cancel susceptance components is not limited to a specific circuit/element, such as a transmission line, a radial line, an inductor and a capacitive element.

Eighth Embodiment

Figure 8:
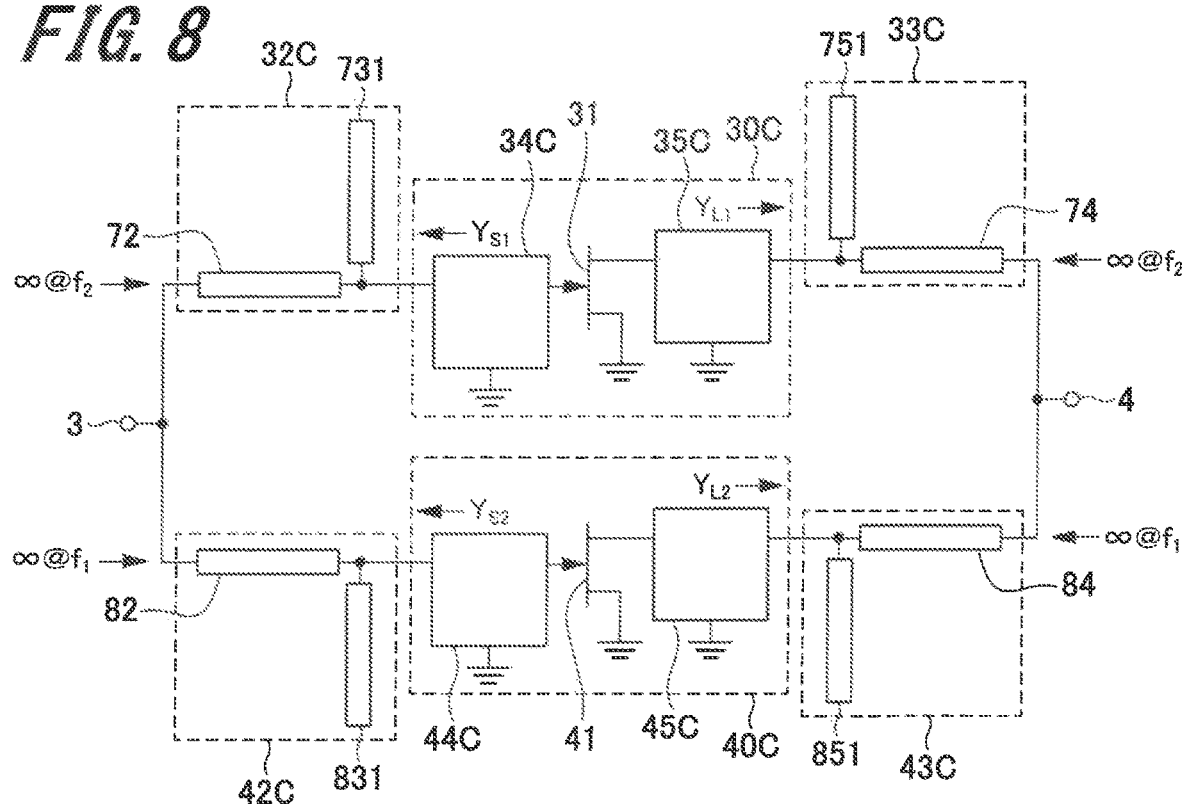
FIG. 8 is a schematic diagram showing the configuration of an amplifier according to an eighth embodiment of the present invention, and is a schematic circuit diagram showing a dual-band amplifier configured by two amplifier circuits.

FIG. 8 is a schematic diagram showing the configuration of an amplifier according to an eighth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 8 are denoted by the same numerals as of FIG. 6 and the explanation thereof will not be repeated.

The eighth embodiment is characterized in that the circuits 73, 75, 83, 85 adapted to short signals in respective frequency bands in input-side blocking circuits 32C, 42C and output-side blocking circuits 33C, 43C (which block signals in respective frequency bands) are formed by parallel stubs 731, 751, 831, 851 whose tips are opened.

The input-side blocking circuit 32C and the output-side blocking circuit 33C (which both block the signal in the second frequency band) are formed by series transmission lines 72, and 74 and the parallel stubs 731 and 751 adapted to short the signal in the second frequency band, wherein the series transmission lines 72 and 74 are each a component whose characteristic impedance is 50Ω and whose length is equal to a quarter of the wavelength of the signal in the second frequency band, and wherein the parallel stubs 731 and 751 are each a component whose tip is opened which has a strip line configuration whose length is equal to a quarter of the wavelength of the signal in the second frequency band.

Further, an input-side blocking circuit 42C and an output-side blocking circuit 43C (which both block the signal in the first frequency band) are formed by series transmission lines 82, and 84 and the parallel stubs 831 and 851 adapted to short-circuit the signal in the first frequency band, wherein the series transmission lines 82 and 84 are each a component whose characteristic impedance is 50Ω and whose length is equal to a quarter of the wavelength of the signal in the first frequency band, and wherein the parallel stubs 831 and 851 are each a component whose tip is opened and which has a strip line configuration whose length is equal to a quarter of the wavelength of the signal in the first frequency band.

The first amplifier circuit 30C connected to the input-side blocking circuit 32C includes a FET 31 (which is an amplifying element), an input impedance matching circuit 34C arranged on the input side of the FET 31, and an output impedance matching circuit 35C arranged on the output side of the FET 31. The output impedance matching circuit 35C is connected to the output-side blocking circuit 33C.

A second amplifier circuit 40C connected to the input-side blocking circuit 42C includes a FET 41 (which is an amplifying element), an input impedance matching circuit 44C arranged on the input side of the FET 41, and an output impedance matching circuit 45C arranged on the output side of the FET 41. The output impedance matching circuit 45C is connected to the output-side blocking circuit 43C.

Incidentally, the parallel stub is not limited to a specific transmission line such as a coplanar transmission line, a radial line and the like.

Ninth Embodiment

Figure 9:
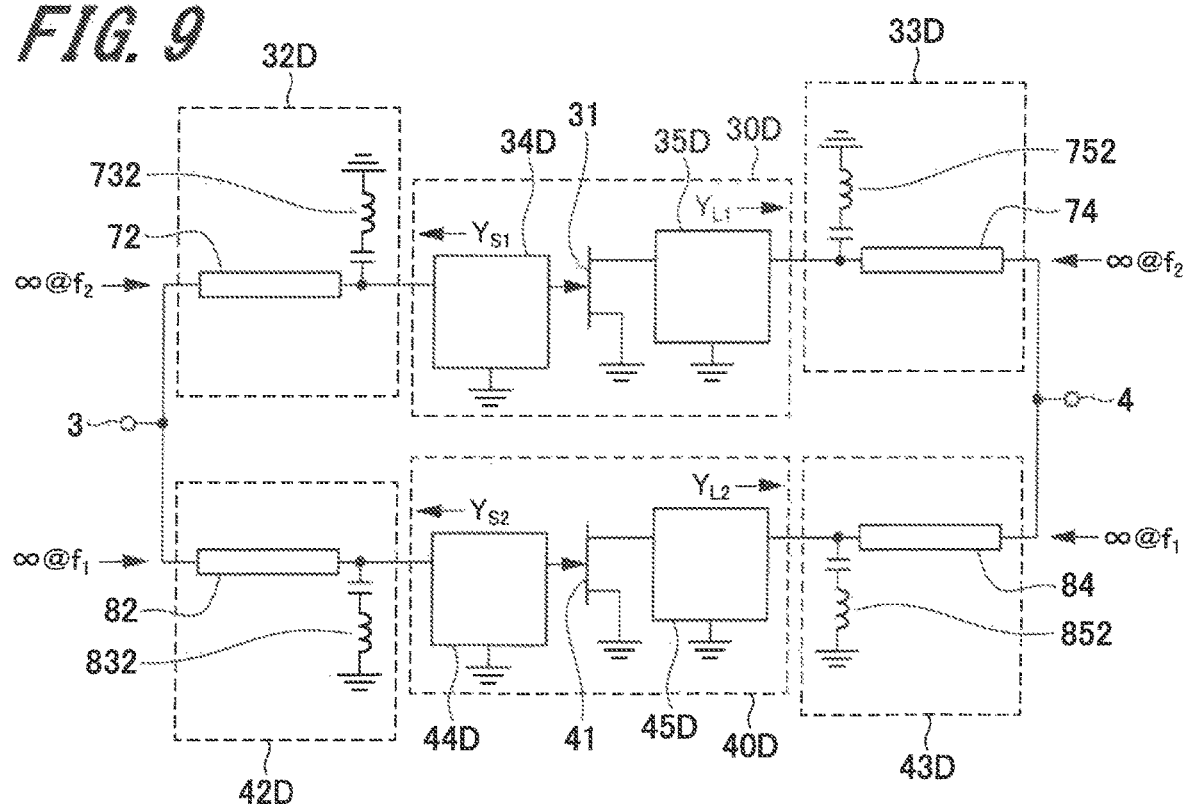
FIG. 9 is a schematic diagram showing the configuration of an amplifier according to a ninth embodiment of the present invention, and is a schematic circuit diagram showing a dual-band amplifier configured by two amplifier circuits.

FIG. 9 is a schematic diagram showing the configuration of an amplifier according to a ninth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 9 are denoted by the same numerals as of FIG. 6 and the explanation thereof will not be repeated.

The ninth embodiment is characterized in that the circuits 73, 75, 83, 85 adapted to short-circuit signals in respective frequency bands in input-side blocking circuits 32D, 42D and output-side blocking circuits 33D, 43D (which block signals in respective frequency bands) are formed by inductor-capacitor series circuits 732, 752, 832, 852.

The input-side blocking circuit 32D and the output-side blocking circuit 33D (which both block the signal in the second frequency band) are formed by series transmission lines 72 and 74 and the inductor-capacitor series circuits 732 and 752, wherein the series transmission lines 72 and 74 are each a component whose characteristic impedance is 50Ω and whose length is equal to a quarter of the wavelength of the signal in the second frequency band, and wherein the inductor-capacitor series circuits 732 and 752 become series resonance short-circuited with respect to the signal in the second frequency band.

An input-side blocking circuit 42D and an output-side blocking circuit 43D (which both block the signal in the first frequency band) are formed by series transmission lines 82 and and the inductor-capacitor series circuits 832 and 852, wherein the series transmission lines 82 and 84 are each a component whose characteristic impedance is 50Ω and whose length is equal to a quarter of the wavelength of the signal in the first frequency band, and wherein the inductor-capacitor series circuits 832 and 852 become series resonance short-circuited with respect to the signal in the first frequency band.

A first amplifier circuit 30D connected to the input-side blocking circuit 32D includes a FET 31 (which is an amplifying element), an input impedance matching circuit 34D arranged on the input side of the FET 31, and an output impedance matching circuit 35D arranged on the output side of the FET 31. The output impedance matching circuit 35D is connected to the output-side blocking circuit 33D.

A second amplifier circuit 40D connected to the input-side blocking circuit 42D includes a FET 41 (which is an amplifying element), an input impedance matching circuit 44D arranged on the input side of the FET 41, and an output impedance matching circuit 45D arranged on the output side of the FET 41. The output impedance matching circuit 45D is connected to the output-side blocking circuit 43D.

Tenth Embodiment

Figure 10:
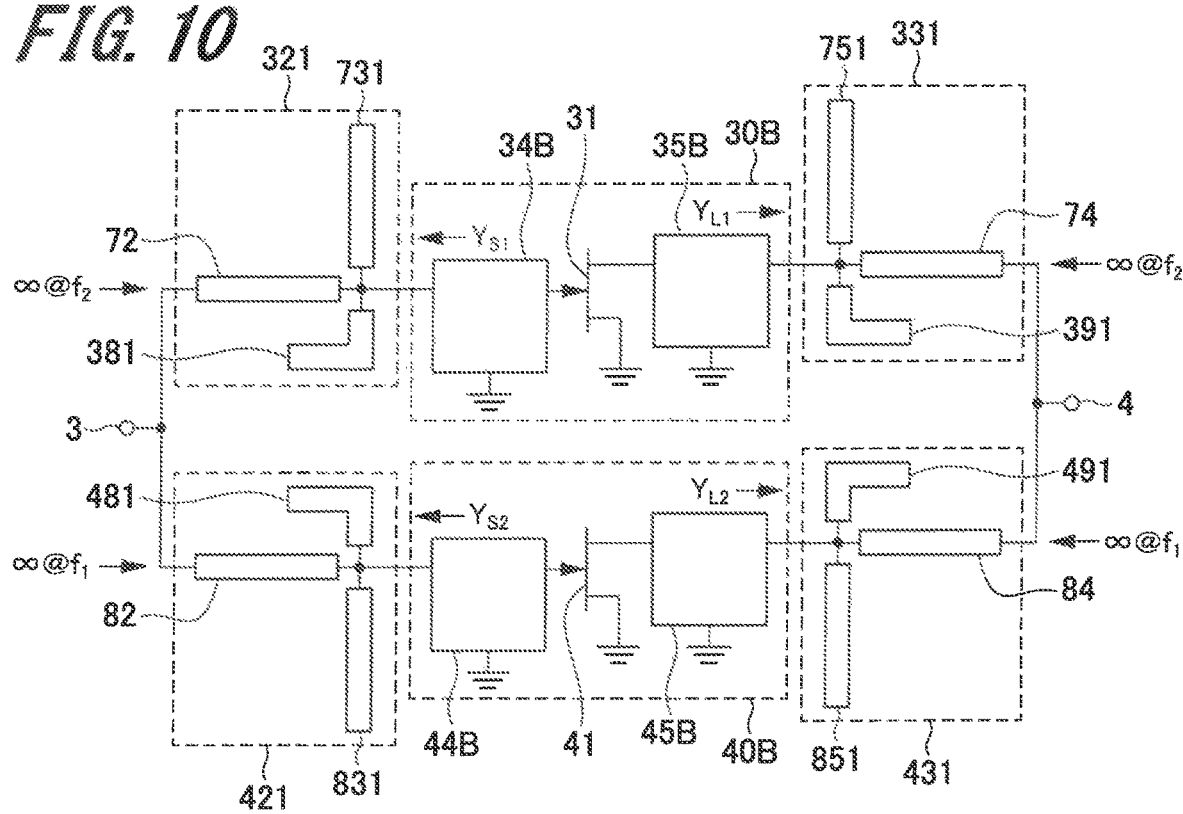
FIG. 10 is a schematic diagram showing the configuration of an amplifier according to a tenth embodiment of the present invention, and is a schematic circuit diagram showing a dual-band amplifier configured by two amplifier circuits.

FIG. 10 is a schematic diagram showing the configuration of an amplifier according to a tenth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 10 are denoted by the same numerals as of FIG. 7 and the explanation thereof will not be repeated.

The tenth embodiment is characterized in that the circuits 73, 75, 83, 85 adapted to short-circuit signals in respective frequency bands in the input-side blocking circuits 321, 421 and output-side blocking circuits 331, 431 (which block signals in respective frequency bands) described in FIG. 7 are formed by parallel stubs 731, 751, 831, 851 whose tips are opened.

A first amplifier circuit 30B is provided with, in an input signal dividing part thereof (which corresponds to the input side of the first amplifier circuit 30B), the input-side blocking circuit 321 adapted to block the signal in a second frequency band. The input-side blocking circuit 321 has a series transmission line 72, a parallel stub 731, and a parallel stub 381, wherein the series transmission line 72 is a component whose characteristic impedance is 50Ω and whose length is equal to a quarter of the wavelength of the signal in the second frequency band, the parallel stub 731 is adapted to short-circuit the signal in the second frequency band, and the parallel stub 381 is adapted to cancel a susceptance component of the parallel stub 731 in the first frequency band, the tip of the parallel stub 381 being opened or short-circuited. The transmission line 72 is connected in series with the main line, and the stub 731 and the stub 381 are connected in parallel to the main line to form the input-side blocking circuit 321.

Further, the first amplifier circuit 30B is provided with, in an output signal combining part thereof (which corresponds to the output side of the first amplifier circuit 30B), the output-side blocking circuit 331 adapted to block the signal in the second frequency band. The output-side blocking circuit 331 has a series transmission line 74, a parallel stub 751, and a parallel stub 391, wherein the series transmission line 74 is a component whose characteristic impedance is 50Ω and whose length is equal to a quarter of the wavelength of the signal in the second frequency band, the parallel stub 751 is adapted to short-circuit the signal in the second frequency band, and the parallel stub 391 is adapted to cancel a susceptance component of the parallel stub 751 in the first frequency band, the tip of the parallel stub 391 being opened or short-circuited. The transmission line 74 is connected in series with the main line, and the stub 751 and the stub 391 are connected in parallel to the main line to form the output-side blocking circuit 331.

Similarly, the second amplifier circuit 40B is provided with, in an input signal combining thereof, the input-side blocking circuit 421 adapted to block the signal in a first frequency band. The input-side blocking circuit 421 has a series transmission line 82, a parallel stub 831, and a parallel stub 481, wherein the series transmission line 82 is a component whose characteristic impedance is 50Ω and whose length is equal to a quarter of the wavelength of the signal in the first frequency band, the parallel stub 831 is adapted to short-circuit the signal in the first frequency band, and the parallel stub 481 is adapted to cancel a susceptance component of the parallel stub 831 in the second frequency band, the tip of the parallel stub 481 being opened or short-circuited. Further, the second amplifier circuit 40B is provided with, in an output signal combining part thereof, the output-side blocking circuit 431 adapted to block the signal in the first frequency band. The output-side blocking circuit 431 has a series transmission line 84, a parallel stub 851, and a parallel stub 491, wherein the serial transmission line 84 is a component whose characteristic impedance is 50Ω and whose length is equal to a quarter of the wavelength of the signal in the first frequency band, the parallel stub 851 is adapted to short-circuit the signal in the first frequency band, and the parallel stub 491 is adapted to cancel a susceptance component of the parallel stub 851 in the second frequency band, the tip of the parallel stub 491 being opened or short-circuited.

Of the signals in the two frequency bands applied to the dual-band amplifier from the signal input terminal 3, the signal in the first frequency band is inputted into the first amplifier circuit 30B through the input-side blocking circuit 321. The signal in the first frequency band amplified by the first amplifier circuit 30B is outputted from the signal output terminal 4 through the output-side blocking circuit 331. Incidentally, the impedance when viewing the input-side blocking circuit 321 (which blocks the signal in the second frequency band) from the signal input terminal 3 is open for the second frequency band. Further, the impedance when viewing the output-side blocking circuit 331 (which blocks the signal in the second frequency band) from the signal output terminal 4 is also open for the second frequency band.

Of the signals in the two frequency bands applied to the dual-band amplifier from the signal input terminal 3, the signal in the second frequency band is inputted into the second amplifier circuit 40B through the input-side blocking circuit 421 (which blocks the signal in the first frequency band) and amplified by the second amplifier circuit 40B. The signal in the second frequency band is outputted from the signal output terminal 4 of the dual-band amplifier through the output-side blocking circuit 431 (which blocks the signal in the first frequency band). The impedance when viewing the input-side blocking circuit 421 and the output-side blocking circuit 431 (which both block the signal in the first frequency band) respectively from the signal input terminal 3 and the signal output terminal 4 is open for the first frequency band.

The first amplifier circuit 30B includes a FET 31 (which is an amplifying element), an input impedance matching circuit 34B arranged on the input side of the FET 31, and an output impedance matching circuit 35B arranged on the output side of the FET 31. The input impedance matching circuit 34B and the output impedance matching circuit 35B include the input-side blocking circuit 321 and the output-side blocking circuit 331 (which both block the signal in the second frequency band), and are adapted to perform input/output impedance matching with respect to the transistor FET 31 (which is an amplifying element).

To be specific, the input impedance matching circuit 34B is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35B is designed such that the admittance when viewing the side of the load from the FET 31 is equal to a load admittance $Y_{LT1}$ of the FET 31 which achieves the maximum power added efficiency of the FET 31. In other words, the input impedance matching circuit 34B and the output impedance matching circuit 35B perform a function for converting a signal source admittance $Y_{S1}$ (=1/(50Ω)) and a load admittance $Y_{L1}$ (=1/(50Ω)) when viewing the input-side blocking circuit 321 and the output-side blocking circuit 331 from the first amplifier circuit 30B respectively into the signal source admittance $Y_{ST1}$ and the load admittance $Y_{LT1}$ of the FET 31 (which both achieve the maximum power added efficiency of the FET 31).

The second amplifier circuit 40B includes a FET 41 (which is an amplifying element), an input impedance matching circuit 44B arranged on the input side of the FET 41, and an output impedance matching circuit 45B arranged on the output side of the FET 41. The input impedance matching circuit 44B and the output impedance matching circuit 45B convert a signal source admittance $Y_{S2}$ (=1/(50Ω)) and a load admittance $Y_{L2}$ (=1/(50Ω)) when viewing the input-side blocking circuit 421 and the output-side blocking circuit 431 (which both block the signal in the first frequency band) from the second amplifier circuit 40B respectively into the signal source admittance $Y_{ST2}$ and the load admittance $Y_{LT2}$ of the FET 41 (which both achieve the maximum power added efficiency of the FET 41). In the present embodiment, since the signal source impedance and the load impedance viewed from each amplifier circuit are each 50Ω, it becomes easy to design and evaluate each amplifier circuit.

Incidentally, each of the parallel stubs 731, 751, 831, 851 adapted to short-circuit signals is not limited to a specific line structure such as a transmission line with opened tip, a radial line, and the like. Each of the parallel stubs 381, 391, 481, 491 adapted to cancel susceptance components is not limited to a specific line structure such as a transmission line with opened tip, a microstrip line, a coplanar line, a radial line and the like.

Eleventh Embodiment

Figure 11:
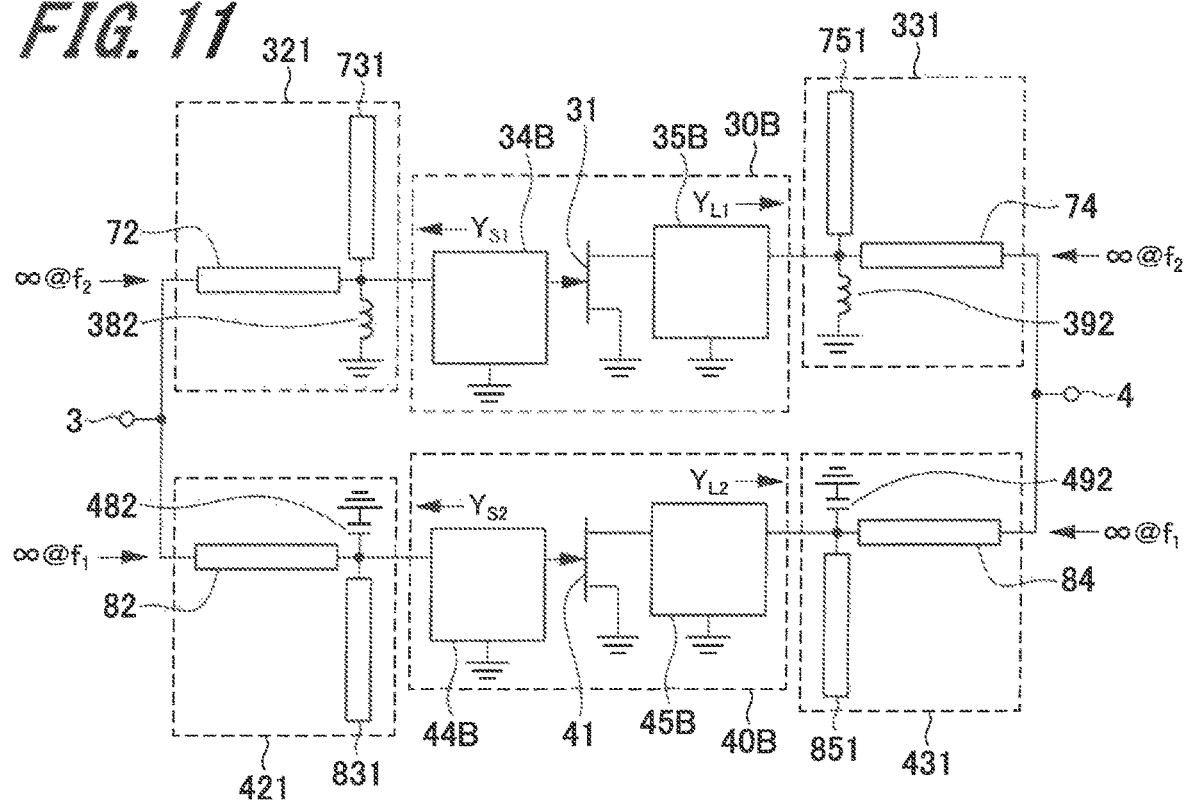
FIG. 11 is a schematic diagram showing the configuration of an amplifier according to an eleventh embodiment of the present invention, and is a schematic circuit diagram showing a dual-band amplifier configured by two amplifier circuits.

FIG. 11 is a schematic diagram showing the configuration of an amplifier according to an eleventh embodiment of the present invention, and is a schematic circuit diagram showing a dual-band amplifier configured by two transistor amplifier circuits (which will each be simply referred to as an "amplifier circuit" hereinafter). Note that, the same components shown in FIG. 11 are denoted by the same numerals as of FIG. 7 and the explanation thereof will not be repeated.

The eleventh embodiment is characterized in that the circuits 73, 83 and 75, 85 adapted to short-circuit signals in respective frequency bands in the input-side blocking circuits 321, 421 and output-side blocking circuits 331, 431 (which block signals in respective frequency bands) described in FIG. are formed by parallel stubs 731, 831 and 751, 851 whose tips are opened.

A first amplifier circuit 30B is provided with, in an input signal dividing part thereof (which corresponds to the input side of the first amplifier circuit 30B), an input-side blocking circuit 321 adapted to block the signal in a second frequency band. The input-side blocking circuit 321 has a series transmission line 72, a parallel stub 731, and a parallel inductor 382, wherein the series transmission line 72 is a component whose characteristic impedance is 50Ω and whose length is equal to a quarter of the wavelength of the signal in the second frequency band $f_2$ (where $f_2 > f_1$), the parallel stub 731 is adapted to short-circuit the signal in the second frequency band $f_2$, and the parallel inductor 382 is adapted to cancel a susceptance component of the parallel stub 731 in the first frequency band $f_1$. The transmission line 72 is connected in series, and the stub 731 and the inductor 382 are connected in parallel to form the input-side blocking circuit 321.

Further, the first amplifier circuit 30B is provided with, in an output signal combining part thereof (which corresponds to the output side of the first amplifier circuit 30B), an output-side blocking circuit 331 adapted to block the signal in the second frequency band. The output-side blocking circuit 331 has a series transmission line 74, a parallel stub 751, and a parallel inductor 392, wherein the series transmission line 72 is a component whose characteristic impedance is 50Ω and whose length is equal to a quarter of the wavelength of the signal in the second frequency band, the parallel stub 751 is adapted to short-circuit the signal in the second frequency band, and the parallel inductor 392 is adapted to cancel a susceptance component of the parallel stub 751 in the first frequency band. The transmission line 74 is connected in series, and the stub 751 and the inductor 392 are connected in parallel to form the output-side blocking circuit 331.

The second amplifier circuit 40B is provided with, in an input signal dividing part thereof, an input-side blocking circuit 421 adapted to block the signal in a first frequency band. The input-side blocking circuit 421 has a series transmission line 82, a parallel stub 831, and a parallel capacitor 482, wherein the series transmission line 82 is a component whose characteristic impedance is 50Ω and whose length is equal to a quarter of the wavelength of the signal in the first frequency band $f_1$ (where $f_2 > f_1$), the parallel stub 831 is adapted to short-circuit the signal in the first frequency band $f_1$, and the parallel capacitor 482 is adapted to cancel a susceptance component of the parallel stub 831 in the second frequency band $f_2$. Further, the second amplifier circuit 40B is provided with, in an output signal combining part thereof, a series transmission line 84, a parallel stub 851 and a parallel capacitor 492 (all these components function as an output-side blocking circuit 431 which blocks the signal in the first frequency band), wherein the series transmission line 84 is a component whose characteristic impedance is 50Ω and whose length is equal to a quarter of the wavelength of the signal in the first frequency band $f_1$, the parallel stub 851 is adapted to short-circuit the signal in the first frequency band, and the parallel capacitor 492 is adapted to cancel the susceptance component of the parallel stub 851 in the second frequency band $f_2$.

Of the signals in the two frequency bands applied to the dual-band amplifier from the signal input terminal 3, the signal in the first frequency band $f_1$ is inputted into the first amplifier circuit 30B through the input-side blocking circuit 321. The signal in the first frequency band amplified by the first amplifier circuit 30B is outputted from the signal output terminal 4 through the output-side blocking circuit 331. The impedance when viewing the input-side blocking circuit 321 (which blocks the signal in the second frequency band) from the signal input terminal 3 is open for the second frequency band. Further, the impedance when viewing the output-side blocking circuit 331 (which blocks the signal in the second frequency band) from the signal output terminal 4 is also open for the second frequency band.

Of the signals in the two frequency bands applied to the dual-band amplifier from the signal input terminal 3, the signal in the second frequency band $f_2$ is inputted into the second amplifier circuit 40B through the input-side blocking circuit 421 (which blocks the signal in the first frequency band) and amplified by the second amplifier circuit 40B. The signal in the second frequency band $f_2$ is outputted from the signal output terminal 4 of the dual-band amplifier through the output-side blocking circuit 431 (which blocks the signal in the first frequency band). The impedance when viewing the input-side blocking circuit 421 and the output-side blocking circuit 431 (which both block the signal in the first frequency band) respectively from the signal input terminal 3 and the signal output terminal 4 is open for the first frequency band.

The first amplifier circuit 30B includes a FET 31 (which is an amplifying element), an input impedance matching circuit 34B arranged on the input side of the FET 31, and an output impedance matching circuit 35B arranged on the output side of the FET 31. The input impedance matching circuit 34B and the output impedance matching circuit 35B include the input-side blocking circuit 321 and the output-side blocking circuit 331 (which both block the signal in the second frequency band), and are adapted to perform input/output impedance matching with respect to the transistor FET 31 (which is an amplifying element).

To be specific, the input impedance matching circuit 34B is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35B is designed such that the admittance when viewing the side of the load from the FET 31 is equal to a load admittance $Y_{LT1}$ of the FET 31 which achieves the maximum power added efficiency of the FET 31. In other words, the input impedance matching circuit 34B and the output impedance matching circuit 35B perform a function for converting a signal source admittance $Y_{S1}$ (=1/(50Ω)) and a load admittance $Y_{L1}$ (=1/(50Ω)) when viewing the input-side blocking circuit 321 and the output-side blocking circuit 331 from the first amplifier circuit 30B respectively into the signal source admittance $Y_{ST1}$ and the load admittance $Y_{LT1}$ of the FET 31 (which both achieve the maximum power added efficiency of the FET 31).

The second amplifier circuit 40B includes a FET 41 (which is an amplifying element), an input impedance matching circuit 44B arranged on the input side of the FET 41, and an output impedance matching circuit 45B arranged on the output side of the FET 41. The input impedance matching circuit 44B and the output impedance matching circuit 45B convert a signal source admittance $Y_{S2}$ (=1/(50Ω)) and a load admittance $Y_{L2}$ (=1/(50Ω)) when viewing the input-side blocking circuit 421 and the output-side blocking circuit 431 (which both block the signal in the first frequency band) from the amplifier circuit 40B respectively into the signal source admittance $Y_{ST2}$ and the load admittance $Y_{LT2}$ of the FET 41 (which both achieve the maximum power added efficiency of the FET 41). In the present embodiment, since the signal source impedance and the load impedance viewed from each amplifier circuit are each 50Ω, it becomes easy to design and evaluate each amplifier circuit.

Incidentally, each of the parallel stubs 731, 751, 831, 851 adapted to short-circuit signals is not limited to a specific line structure such as a transmission line with opened tip, a radial line, and the like.

Twelfth Embodiment

Figure 12:
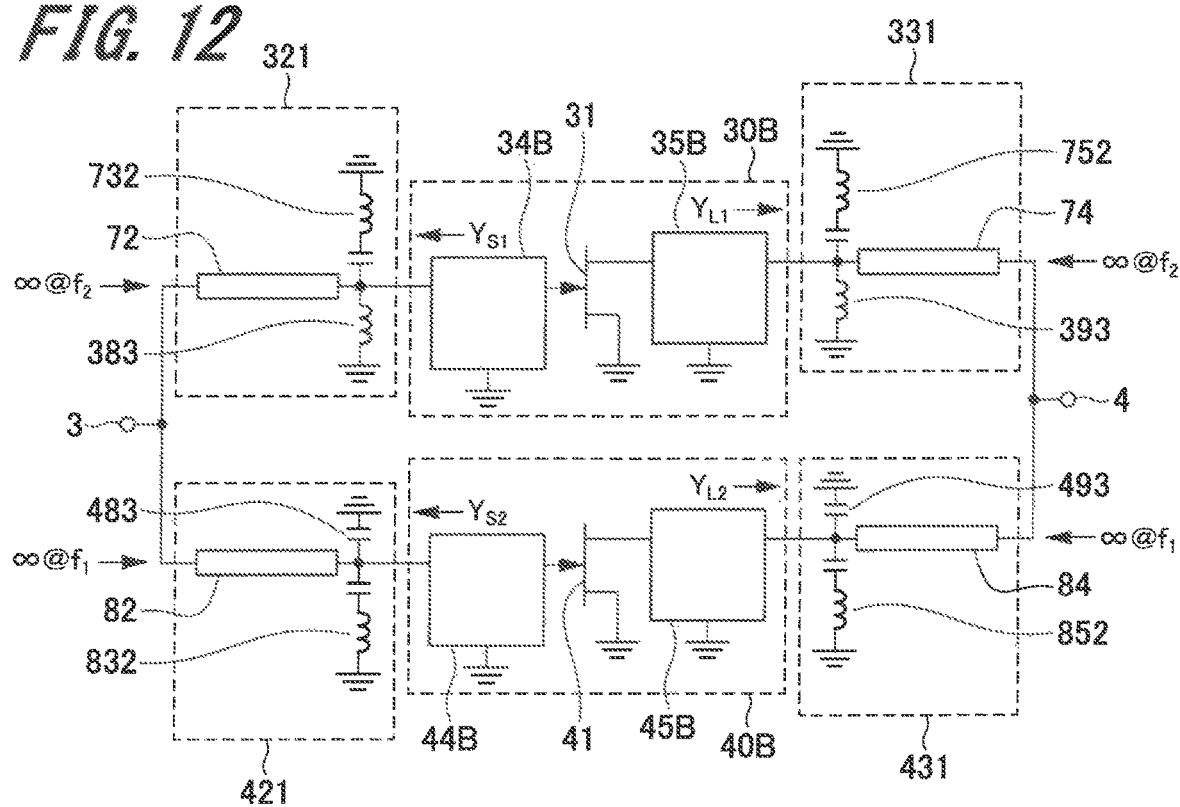
FIG. 12 is a schematic diagram showing the configuration of an amplifier according to a twelfth embodiment of the present invention, and is a schematic circuit diagram showing a dual-band amplifier configured by two amplifier circuits.

FIG. 12 is a schematic diagram showing the configuration of an amplifier according to a twelfth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 12 are denoted by the same numerals as of FIG. 7 and the explanation thereof will not be repeated.

The twelfth embodiment is characterized in that the circuits 73, 83 and 75, 85 adapted to short-circuit signals in respective frequency bands in the input-side blocking circuits 321, 421 and output-side blocking circuits 331, 431 (which block signals in respective frequency bands) described in FIG. are formed by inductor-capacitor series circuits 732, 832 and 752, 852.

A first amplifier circuit 30B is provided with, in an input signal dividing part thereof (which corresponds to the input side of the first amplifier circuit 30B), an input-side blocking circuit 321 adapted to block the signal in a second frequency band. The input-side blocking circuit 321 has a series transmission line 72, an inductor-capacitor series circuit 732, and a parallel inductor 383, wherein the series transmission line 72 is a component whose characteristic impedance is 50Ω and whose length is equal to a quarter of the wavelength of the signal in the second frequency band $f_2$ (where $f_2 > f_1$), the inductor-capacitor series circuit 732 is adapted to short-circuit the signal in the second frequency band, and the parallel inductor 383 is adapted to cancel a susceptance component of the inductor-capacitor series circuit 732 in the first frequency band $f_1$. The series transmission line 72 is connected in series, and the inductor-capacitor series circuit 732 and the inductor 383 are connected in parallel to form the input-side blocking circuit 321.

Further, the first amplifier circuit 30B is provided with, in an output signal combining part thereof (which corresponds to the output side of the first amplifier circuit 30B), an output-side blocking circuit 331 adapted to block the signal in the second frequency band. The output-side blocking circuit 331 has a series transmission line 74, an inductor-capacitor series circuit 752, and a parallel inductor 393, wherein the series transmission line 74 is a component whose characteristic impedance is 50Ω and whose length is equal to a quarter of the wavelength of the signal in the second frequency band $f_2$, the inductor-capacitor series circuit 752 is adapted to short-circuit the signal in the second frequency band, and the parallel inductor 393 is adapted to cancel a susceptance component of the inductor-capacitor series circuit 752 in the first frequency band $f_1$. The transmission line 74 is connected in series, and the inductor-capacitor series circuit 752 and the inductor 393 are connected in parallel to form the output-side blocking circuit 331.

A second amplifier circuit 40B is provided with, in an input signal dividing part thereof, an input-side blocking circuit 421 adapted to block the signal in a first frequency band. The input-side blocking circuit 421 has a series transmission line 82, an inductor-capacitor series circuit 832, and a parallel capacitor 483, wherein the series transmission line 82 is a component whose characteristic impedance is 50Ω and whose length is equal to a quarter of the wavelength of the signal in the first frequency band $f_1$ (where $f_2 > f_1$), the inductor-capacitor series circuit 832 is adapted to short-circuit the signal in the first frequency band, and the parallel capacitor 483 is adapted to cancel a susceptance component of the inductor-capacitor series circuit 832 in the second frequency band $f_2$. Further, the second amplifier circuit 40B is provided with, in an output signal combining part thereof, a series transmission line 84, an inductor-capacitor series circuit 852 and a parallel capacitor 483 (all these components function as an output-side blocking circuit 431 which blocks the signal in the first frequency band), wherein the series transmission line 84 is a component whose characteristic impedance is 50Ω and whose length is equal to a quarter of the wavelength of the signal in the first frequency band $f_1$, the inductor-capacitor series circuit 852 is adapted to short-circuit the signal in the first frequency band, and the parallel capacitor 493 is adapted to cancel a susceptance component of the inductor-capacitor series circuit 852 in the second frequency band $f_2$.

Of the signals in the two frequency bands applied to the dual-band amplifier from the signal input terminal 3, the signal in the first frequency band $f_1$ is inputted into the first amplifier circuit 30B through the input-side blocking circuit 321. The signal in the first frequency band amplified by the first amplifier circuit 30B is outputted from the signal output terminal 4 through the output-side blocking circuit 331. The impedance when viewing the input-side blocking circuit 321 (which blocks the signal in the second frequency band) from the signal input terminal 3 is open for the second frequency band. Further, the impedance when viewing the output-side blocking circuit 331 (which blocks the signal in the second frequency band) from the signal output terminal 4 is also open for the second frequency band.

Of the signals in the two frequency bands applied to the dual-band amplifier from the signal input terminal 3, the signal in the second frequency band $f_2$ is inputted into the second amplifier circuit 40B through the input-side blocking circuit 421 (which blocks the signal in the first frequency band) and amplified by the second amplifier circuit 40B. The signal in the second frequency band $f_2$ is extracted from the signal output terminal 4 of the dual-band amplifier through the output-side blocking circuit 431 (which blocks the signal in the first frequency band). The impedance when viewing the input-side blocking circuit 421 and the output-side blocking circuit 431 (which both block the signal in the first frequency band) respectively from the signal input terminal 3 and the signal output terminal 4 is open for the first frequency band.

The first amplifier circuit 30B includes a FET 31 (which is an amplifying element), an input impedance matching circuit 34B arranged on the input side of the FET 31, and an output impedance matching circuit 35B arranged on the output side of the FET 31. The input impedance matching circuit 34B and the output impedance matching circuit 35B include the input-side blocking circuit 321 and the output-side blocking circuit 331 (which both block the signal in the second frequency band), and are adapted to perform input/output impedance matching with respect to the transistor FET 31 (which is an amplifying element).

To be specific, the input impedance matching circuit 34B is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35B is designed such that the admittance when viewing the side of the load from the FET 31 is equal to a load admittance $Y_{LT1}$ of the FET 31 which achieves the maximum power added efficiency of the FET 31. In other words, the input impedance matching circuit 34B and the output impedance matching circuit 35B perform a function for converting a signal source admittance $Y_{S1}$ (=1/(50Ω)) and a load admittance $Y_{L1}$ (=1/(50Ω)) when viewing the input-side blocking circuit 321 and the output-side blocking circuit 331 from the first amplifier circuit 30B respectively into the signal source admittance $Y_{ST1}$ and the load admittance $Y_{LT1}$ of the FET 31 (which both achieve the maximum power added efficiency of the FET 31).

The second amplifier circuit 40B includes a FET 41 (which is an amplifying element), an input impedance matching circuit 44B arranged on the input side of the FET 41, and an output impedance matching circuit 45B arranged on the output side of the FET 41. The input impedance matching circuit 44B and the output impedance matching circuit 45B convert a signal source admittance $Y_{S2}$ (=1/(50Ω)) and a load admittance $Y_{L2}$ (=1/(50Ω)) when viewing the input-side blocking circuit 421 and the output-side blocking circuit 431 (which both block the signal in the first frequency band) from the second amplifier circuit 40B respectively into the signal source admittance $Y_{ST2}$ and the load admittance $Y_{LT2}$ of the FET 41 (which both achieve the maximum power added efficiency of the FET 41). In the present embodiment, since the signal source impedance and the load impedance viewed from each amplifier circuit are each 50Ω, it becomes easy to design and evaluate each amplifier circuit.

Thirteenth Embodiment

Figure 13:
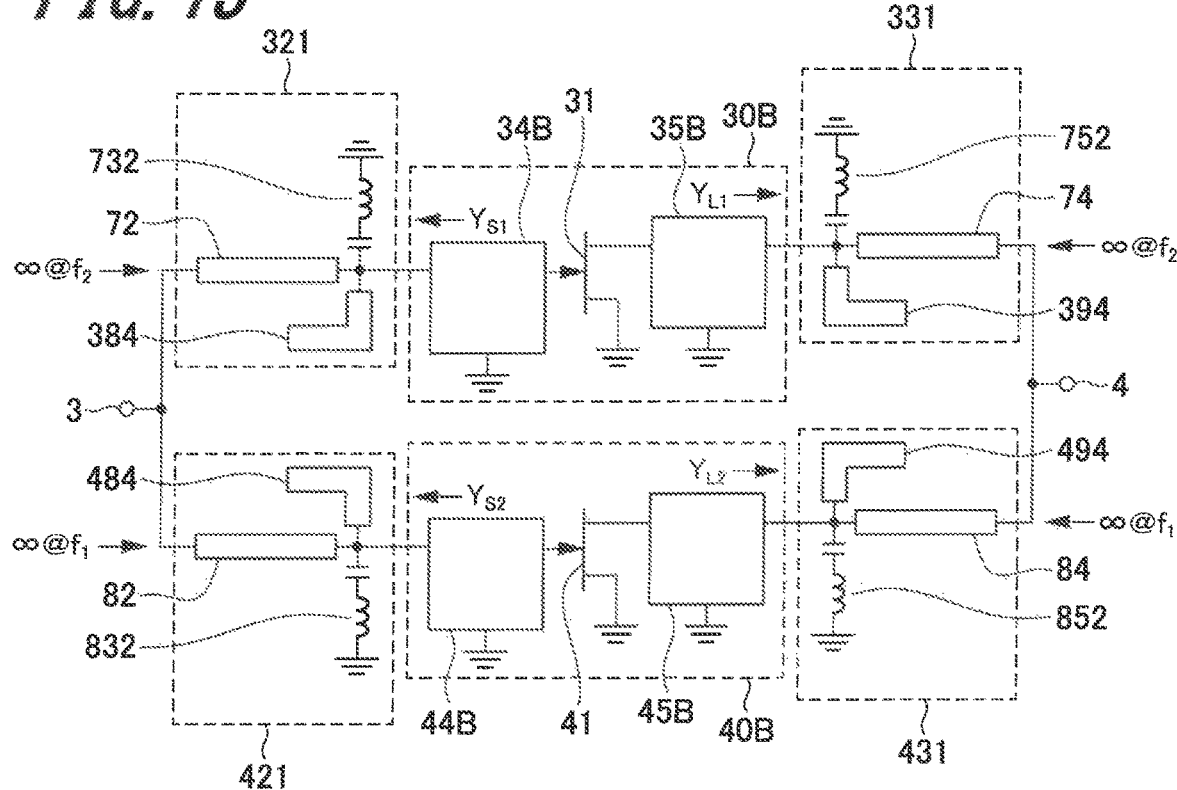
FIG. 13 is a schematic diagram showing the configuration of an amplifier according to a thirteenth embodiment of the present invention, and is a schematic circuit diagram showing a dual-band amplifier configured by two amplifier circuits.

FIG. 13 is a schematic diagram showing the configuration of an amplifier according to a thirteenth embodiment of the present invention, and is a schematic circuit diagram showing a dual-band amplifier configured by two transistor amplifier circuits (which will each be simply referred to as an "amplifier circuit" hereinafter). Note that, the same components shown in FIG. 13 are denoted by the same numerals as of FIG. 7 and the explanation thereof will not be repeated.

The thirteenth embodiment is characterized in that the circuits 73, 83 and 75, 85 adapted to short-circuit signals in respective frequency bands in the input-side blocking circuits 321, 421 and output-side blocking circuits 331, 431 (which block signals in respective frequency bands) described in FIG. are formed by inductor-capacitor series circuits 732, 832 and 752, 852.

A first amplifier circuit 30B is provided with, in an input signal dividing part thereof (which corresponds to the input side of the first amplifier circuit 30B), an input-side blocking circuit 321 adapted to block the signal in a second frequency band. The input-side blocking circuit 321 has a series transmission line 72, an inductor-capacitor series circuit 732, and a parallel stub 384, wherein the series transmission line 72 is a component whose characteristic impedance is 50Ω and whose length is equal to a quarter of the wavelength of the signal in the second frequency band $f_2$ (where $f_2 > f_1$), the inductor-capacitor series circuit 732 is adapted to short-circuit the signal in the second frequency band, and the parallel stub 384 is adapted to cancel a susceptance component of the inductor-capacitor series circuit 732 in the first frequency band $f_1$, the tip of the parallel stub 384 being opened or short-circuited. The transmission line 72 is connected in series with the main line, and the inductor-capacitor series circuit 732 and the stub 384 are connected in parallel to the main line to form the input-side blocking circuit 321.

Further, the first amplifier circuit 30B is provided with, in an output signal combining part thereof (which corresponds to the output side of the first amplifier circuit 30B), an output-side blocking circuit 331 adapted to block the signal in the second frequency band. The output-side blocking circuit 331 has a series transmission line 74, an inductor-capacitor series circuit 752, and a parallel stub 394, wherein the series transmission line 74 is a component whose characteristic impedance is 50Ω and whose length is equal to a quarter of the wavelength of the signal in the second frequency band $f_2$, the inductor-capacitor series circuit 752 is adapted to short-circuit the signal in the second frequency band, and the parallel stub 394 is adapted to cancel a susceptance component of the inductor-capacitor series circuit 752 in the first frequency band $f_1$, the tip of the parallel stub 394 being opened or short-circuited. The transmission line 74 is connected in series with the main line, and the inductor-capacitor series circuit 752 and the stub 394 are connected in parallel to the main line to form the input-side blocking circuit 331.

A second amplifier circuit 40B is provided with, in an input signal dividing part thereof, an input-side blocking circuit 421 adapted to block the signal in a first frequency band. The input-side blocking circuit 421 has a series transmission line 82, an inductor-capacitor series circuit 832, and a parallel stub 484, wherein the series transmission line 82 is a component whose characteristic impedance is 50Ω and whose length is equal to a quarter of the wavelength of the signal in the first frequency band $f_1$ (where $f_2 > f_1$), the inductor-capacitor series circuit 832 is adapted to short-circuit the signal in the first frequency band, and the parallel stub 484 is adapted to cancel a susceptance component of the inductor-capacitor series circuit 832 in the second frequency band, the tip of the parallel stub 484 being opened or short-circuited.

Further, the second amplifier circuit 40B is provided with, in an output signal combining part thereof, an output-side blocking circuit 431 adapted to block the signal in the first frequency band. The output-side blocking circuit 431 has a series transmission line 84, an inductor-capacitor series circuit 852, and a parallel stub 494, wherein the series transmission line 84 is a component whose characteristic impedance is 50Ω and whose length is equal to a quarter of the wavelength of the signal in the first frequency band $f_1$, the inductor-capacitor series circuit 852 is adapted to short-circuit the signal in the first frequency band, and the parallel stub 494 is adapted to cancel a susceptance component of the inductor-capacitor series circuit 852 in the second frequency band $f_2$, the tip of the parallel stub 494 being opened or short-circuited.

Of the signals in the two frequency bands applied to the dual-band amplifier from the signal input terminal 3, the signal in the first frequency band $f_1$ is inputted into the first amplifier circuit 30B through the input-side blocking circuit 321. The signal in the first frequency band amplified by the first amplifier circuit 30B is outputted from the signal output terminal 4 through the output-side blocking circuit 331. The impedance when viewing the input-side blocking circuit 321 (which blocks the signal in the second frequency band) from the signal input terminal 3 is open for the second frequency band. Further, the impedance when viewing the output-side blocking circuit 331 (which blocks the signal in the second frequency band) from the signal output terminal 4 is also open for the second frequency band.

Of the signals in the two frequency bands applied to the dual-band amplifier from the signal input terminal 3, the signal in the second frequency band $f_2$ is inputted into the second amplifier circuit 40B through the input-side blocking circuit 421 (which blocks the signal in the first frequency band) and amplified by the second amplifier circuit 40B. The signal in the second frequency band $f_2$ is outputted from the signal output terminal 4 of the dual-band amplifier through the output-side blocking circuit 431 (which blocks the signal in the first frequency band). The impedance when viewing the input-side blocking circuit 421 and the output-side blocking circuit 431 (which both block the signal in the first frequency band) respectively from the signal input terminal 3 and the signal output terminal 4 is open for the second frequency band.

The first amplifier circuit 30B includes a FET 31 (which is an amplifying element), an input impedance matching circuit 34B arranged on the input side of the FET 31, and an output impedance matching circuit 35B arranged on the output side of the FET 31. The input impedance matching circuit 34B and the output impedance matching circuit 35B include the input-side blocking circuit 321 and the output-side blocking circuit 331 (which both block the signal in the second frequency band), and are adapted to perform input/output impedance matching with respect to the transistor FET 31 (which is an amplifying element).

To be specific, the input impedance matching circuit 34B is designed such that the admittance when viewing the side of the signal source from the FET 31 is equal to a signal source admittance $Y_{ST1}$ of the FET 31 which achieves the maximum power added efficiency of the FET 31. Further, the output impedance matching circuit 35B is designed such that the admittance when viewing the side of the load from the FET 31 is equal to a load admittance $Y_{LT1}$ of the FET 31 which achieves the maximum power added efficiency of the FET 31. In other words, the input impedance matching circuit 34B and the output impedance matching circuit 35B perform a function for converting a signal source admittance $Y_{S1}$ (=1/(50Ω)) and a load admittance $Y_{L1}$ (=1/(50Ω)) when viewing the input-side blocking circuit 321 and the output-side blocking circuit 331 from the first amplifier circuit 30B respectively into the signal source admittance $Y_{ST1}$ and the load admittance $Y_{LT1}$ of the FET 31 (which both achieve the maximum power added efficiency of the FET 31).

The second amplifier circuit 40B includes a FET 41 (which is an amplifying element), an input impedance matching circuit 44B arranged on the input side of the FET 41, and an output impedance matching circuit 45B arranged on the output side of the FET 41. The input impedance matching circuit 44B and the output impedance matching circuit 45B convert a signal source admittance $Y_{S2}$ (=1/(50Ω)) and a load admittance $Y_{L2}$ (=1/(50Ω)) when viewing the input-side blocking circuit 421 and the output-side blocking circuit 431 (which both block the signal in the first frequency band) from the second amplifier circuit 40B respectively into the signal source admittance $Y_{ST2}$ and the load admittance $Y_{LT2}$ of the FET 41 (which both achieve the maximum power added efficiency of the FET 41). In the present embodiment, since the signal source impedance and the load impedance viewed from each amplifier circuit are each 50Ω, it becomes easy to design and evaluate each amplifier circuit.

Incidentally, each of the parallel stubs 384, 394, 484, 494 adapted to short-circuit signals is not limited to a specific line structure such as a transmission line with opened tip, a radial line, and the like.

REFERENCE SIGNS LIST 1, 3 signal input terminal
2, 4 signal output terminal
10, 20, 30, 30A, 30B, 30C, 30D, 40, 40A, 40B, 40C, 40D, 50, 70 amplifier circuit
11, 21, 31, 41, 51, 61 amplifying element (FET)
12, 22, 32, 32C, 32D, 42, 42C, 42D, 36, 46, 52, 57, 67, 72, 321, 421 input-side blocking circuit
13, 23, 33, 33C, 33D, 43, 43C, 43D, 37, 47, 53, 59, 69, 73, 331, 431 output-side blocking circuit
14, 24, 34, 34B, 34C, 34D, 44, 44B, 44C, 44D, 54, 64, 74 input impedance matching circuit
15, 25, 35, 35B, 35C, 35D, 45, 45B, 45C, 45D, 55, 65, 75 output impedance matching circuit
38, 39, 83, 85 cancellation circuit
72, 74, 82, 84 serial transmission line
73, 75, 83, 85 parallel circuit
381, 384, 391, 394, 481, 484, 491, 494, 731, 751, 831, 851 parallel stub
483, 493 parallel capacitor
732, 752, 832, 852 inductor-capacitor series circuit

The invention claimed is:

1. A dual-band amplifier which concurrently amplifies a signal in a first frequency band and a signal in a second frequency band, comprising:
   a first amplifier circuit which amplifies the signal in the first frequency band; and
   a second amplifier circuit which amplifies the signal in the second frequency band,
   wherein the first amplifier circuit has a second frequency band blocking circuit arranged in each of an input signal dividing part and an output signal combining part of the first amplifier circuit, the second frequency band blocking circuit blocking the signal in the second frequency band,
   wherein the second amplifier circuit has a first frequency band blocking circuit arranged in each of an input signal dividing part and an output signal combining part of the second amplifier circuit, the first frequency band blocking circuit blocking the signal in the first frequency band, wherein the second frequency band blocking circuit is formed by providing in series a circuit in each of the input signal dividing part and the output signal combining part of the first amplifier circuit, the circuit being a circuit whose parallel resonance frequency falls into the second frequency band, wherein the first frequency band blocking circuit is formed by providing in series a circuit in each of the input signal dividing part and the output signal combining part of the second amplifier circuit, the circuit being a circuit whose parallel resonance frequency falls into the first frequency band, wherein the second frequency band blocking circuit is formed by further providing in series an inserted circuit element in each of the input signal dividing part and the output signal combining part of the first amplifier circuit, the circuit element cancelling a series reactance component of the circuit in the first frequency band, and wherein the first frequency band blocking circuit is formed by further providing in series an inserted circuit element in each of the input signal dividing part and the output signal combining part of the second amplifier circuit, the circuit element cancelling a series reactance component of the circuit in the second frequency band.

2. The dual-band amplifier according to claim 1, wherein the circuit whose parallel resonance frequency falls into the second frequency band and the circuit whose parallel resonance frequency falls into the first frequency band are each formed by an inductor and a capacitor connected to each other in parallel.

3. A dual-band amplifier which concurrently amplifies a signal in a first frequency band and a signal in a second frequency band, comprising:

a first amplifier circuit which amplifies the signal in the first frequency band; and a second amplifier circuit which amplifies the signal in the second frequency band, wherein the first amplifier circuit has a second frequency band blocking circuit arranged in each of an input signal dividing part and an output signal combining part of the first amplifier circuit, the second frequency band blocking circuit blocking the signal in the second frequency band, wherein the second amplifier circuit has a first frequency band blocking circuit arranged in each of an input signal dividing part and an output signal combining part of the second amplifier circuit, the first frequency band blocking circuit blocking the signal in the first frequency band, wherein the second frequency band blocking circuit is formed by a series transmission line whose characteristic impedance is 50Ω and whose length is equal to a quarter of the wavelength of the signal in the second frequency band, and a circuit which short-circuits the signal in the second frequency band, and wherein the first frequency band blocking circuit is formed by a series transmission line whose characteristic impedance is 50Ω and whose length is equal to a quarter of the wavelength of the signal in the first frequency band, and a circuit which short-circuits the signal in the first frequency band.

4. A dual-band amplifier which concurrently amplifies a signal in a first frequency band and a signal in a second frequency band, comprising:

a first amplifier circuit which amplifies the signal in the first frequency band; and a second amplifier circuit which amplifies the signal in the second frequency band, wherein the first amplifier circuit has a second frequency band blocking circuit arranged in each of an input signal dividing part and an output signal combining part of the first amplifier circuit, the second frequency band blocking circuit blocking the signal in the second frequency band, wherein the second amplifier circuit has a first frequency band blocking circuit arranged in each of an input signal dividing part and an output signal combining part of the second amplifier circuit, the first frequency band blocking circuit blocking the signal in the first frequency band, wherein the second frequency band blocking circuit is formed by a series transmission line whose characteristic impedance is 50Ω and whose length is equal to a quarter of the wavelength of the signal in the second frequency band, a circuit which short-circuits the signal in the second frequency band, and a circuit which cancels, in the first frequency band, a susceptance component of the circuit which short-circuits the signal in the second frequency band, and wherein the first frequency band blocking circuit is formed by a series transmission line whose characteristic impedance is 50Ω and whose length is equal to a quarter of the wavelength of the signal in the first frequency band, a circuit which short-circuits the signal in the first frequency band, and a circuit which cancels, in the second frequency band, a susceptance component of the circuit which short-circuits the signal in the first frequency band.

5. The dual-band amplifier according to claim 3, wherein the circuit which short-circuits the signal in the second frequency band provided in each of the input signal dividing part and the output signal combining part of the first amplifier circuit is formed by a parallel stub whose tip is opened, and wherein the circuit which short-circuits the signal in the first frequency band provided in each of the input signal dividing part and the output signal combining part of the second amplifier circuit is formed by a parallel stub whose tip is opened.

6. The dual-band amplifier according to claim 3, wherein the circuit which short-circuits the signal in the second frequency band provided in each of the input signal dividing part and the output signal combining part of the first amplifier circuit is formed by a series resonance circuit consisting of an inductor and a capacitor, and wherein the circuit which short-circuits the signal in the first frequency band provided in each of the input signal dividing part and the output signal combining part of the second amplifier circuit is formed by a series resonance circuit consisting of an inductor and a capacitor.

7. The dual-band amplifier according to claim 4, wherein the circuit which short-circuits the signal in the second frequency band and the circuit which cancels, in the first frequency band, a susceptance component of the circuit which short-circuits the signal in the second frequency band provided in each of the input signal dividing part and the output signal combining part of the first amplifier circuit are each formed by a parallel stub whose tip is opened or short-circuited, and wherein the circuit which short-circuits the signal in the first frequency band and the circuit which cancels, in the second frequency band, a susceptance component of the circuit which short-circuits the signal in the first frequency band provided in each of the input signal dividing part and the output signal combining part of the second amplifier circuit are each formed by a parallel stub whose tip is opened or short-circuited.

8. The dual-band amplifier according to claim 4, wherein the circuit which short-circuits the signal in the second frequency band provided in each of the input signal dividing part and the output signal combining part of the first amplifier circuit is formed by a parallel stub whose tip is opened; and the circuit which cancels, in the first frequency band, a susceptance component of the circuit which short-circuits the signal in the second frequency band provided in each of the input signal dividing part and the output signal combining part of the first amplifier circuit is formed by an inductor, and wherein the circuit which short-circuits the signal in the first frequency band provided in each of the input signal dividing part and the output signal combining part of the second amplifier circuit is formed by a parallel stub whose tip is opened; and the circuit which cancels, in the second frequency band, a susceptance component of the circuit which short-circuits the signal in the first frequency band provided in each of the input signal dividing part and the output signal combining part of the first amplifier circuit is formed by a capacitor.

9. The dual-band amplifier according to claim 4, wherein the circuit which short-circuits the signal in the second frequency band provided in each of the input signal dividing part and the output signal combining part of the first amplifier circuit is formed by a series resonance circuit consisting of an inductor and a capacitor; and the circuit which cancels, in the first frequency band, a susceptance component of the circuit which short-circuits the signal in the second frequency band provided in each of the input signal dividing part and the output signal combining part of the first amplifier circuit is formed by an inductor, and wherein the circuit which short-circuits the signal in the first frequency band provided in each of the input signal dividing part and the output signal combining part of the second amplifier circuit is formed by a series resonance circuit consisting of an inductor and a capacitor; and the circuit which cancels, in the second frequency band, a susceptance component of the circuit which short-circuits the signal in the first frequency band provided in each of the input signal dividing part and the output signal combining part of the second amplifier circuit is formed by a capacitor.

10. The dual-band amplifier according to claim 4, wherein the circuit which short-circuits the signal in the second frequency band provided in each of the input signal dividing part and the output signal combining part of the first amplifier circuit is formed by a series resonance circuit consisting of an inductor and a capacitor; and the circuit which cancels, in the first frequency band, a susceptance component of the circuit which short-circuits the signal in the second frequency band provided in each of the input signal dividing part and the output signal combining part of the first amplifier circuit is formed by a parallel stub whose tip is opened or short-circuited, and wherein the circuit which short-circuits the signal in the first frequency band provided in each of the input signal dividing part and the output signal combining part of the second amplifier circuit is formed by a series resonance circuit consisting of an inductor and a capacitor; and the circuit which cancels, in the second frequency band, a susceptance component of the circuit which short-circuits the signal in the first frequency band provided in each of the input signal dividing part and the output signal combining part of the second amplifier circuit is formed by a parallel stub whose tip is opened or short-circuited.

11. The dual-band amplifier according to claim 1, wherein the first amplifier circuit and the second amplifier circuit each have an input impedance matching circuit and an output impedance matching circuit, and wherein the input impedance matching circuit and the output impedance matching circuit of the first amplifier circuit and the second amplifier circuit have a signal source impedance and a load impedance of a transistor so that optimal signal input/output characteristics of the input impedance matching circuit and the output impedance matching circuit of the first amplifier circuit and the second amplifier circuit in the first frequency band and the second frequency band are achieved.

* * * * *